(12) United States Patent
Maenishi et al.

(10) Patent No.: US 8,019,455 B2
(45) Date of Patent: Sep. 13, 2011

(54) COMPONENT MOUNTING ORDER DECIDING METHOD AND COMPONENT MOUNTING ORDER DECIDING APPARATUS

(75) Inventors: Yasuhiro Maenishi, Yamanashi (JP); Ikuo Yoshida, Kyoto (JP)

(73) Assignee: Panasonic Corporation, Osaka (JP)

(*) Notice: Subject to any disclaimer, the term of this patent is extended or adjusted under 35 U.S.C. 154(b) by 1215 days.

(21) Appl. No.: 11/569,127

(22) PCT Filed: May 16, 2005

(86) PCT No.: PCT/JP2005/009288
§ 371 (c)(1),
(2), (4) Date: Jan. 10, 2007

(87) PCT Pub. No.: WO2005/112534
PCT Pub. Date: Nov. 24, 2005

(65) Prior Publication Data
US 2008/0262642 A1  Oct. 23, 2008

(30) Foreign Application Priority Data

May 17, 2004 (JP) .................. 2004-174841

(51) Int. Cl.
*G06F 19/00* (2006.01)
*G06F 7/00* (2006.01)
*G06F 17/00* (2006.01)
*H05K 13/04* (2006.01)
*B23P 19/00* (2006.01)
*H01L 21/00* (2006.01)

(52) U.S. Cl. ............ 700/99; 700/95; 700/114; 700/117; 700/121; 700/218; 700/231; 29/729; 29/760; 438/1

(58) Field of Classification Search ............... 700/95, 700/99, 114, 117, 121, 218, 231; 29/729, 29/760; 438/1
See application file for complete search history.

(56) References Cited

U.S. PATENT DOCUMENTS

| | | | | |
|---|---|---|---|---|
| 5,147,176 A * | 9/1992 | Stolzer et al. | ............... | 414/807 |
| 5,380,390 A * | 1/1995 | Tselesin | ............... | 156/230 |
| 5,740,604 A * | 4/1998 | Kitamura et al. | ............... | 29/832 |
| 5,784,777 A * | 7/1998 | Asai et al. | ............... | 29/832 |
| 6,002,650 A * | 12/1999 | Kuribayashi et al. | ......... | 700/117 |
| 6,149,379 A * | 11/2000 | Shin et al. | ............... | 414/811 |
| 6,161,214 A | 12/2000 | Ishihara et al. | | |
| 6,199,272 B1 * | 3/2001 | Seto et al. | ............... | 29/740 |

(Continued)

FOREIGN PATENT DOCUMENTS

JP  06-232591 A  8/1994

(Continued)

*Primary Examiner* — Albert Decady
*Assistant Examiner* — Jennifer L Norton
(74) *Attorney, Agent, or Firm* — Pearne & Gordon LLP

(57) ABSTRACT

To provide a component mounting order optimizing method and a component mounting order optimizing apparatus by which it is easy to change a preparatory plan and it is possible to shorten time necessary for a change of substrates to be produced.

An optimization program storage section 16 has a placement list preparing section 17 which obtains component placement data to be obtainable by a component information reading device 5 reading identification information of a component cassette, and prepares a component placement list in which identification information of component cassettes and positions which are loaded in a component supply section were associated, and a mounting order deciding section 18 which decides mounting order of components in such a state that an array of the component cassettes is fixed, on the basis of the component placement list.

13 Claims, 20 Drawing Sheets

U.S. PATENT DOCUMENTS

| | | | |
|---|---|---|---|
| 6,392,403 B1 * | 5/2002 | Conboy et al. | 324/158.1 |
| 6,836,960 B2 * | 1/2005 | Hamasaki et al. | 29/832 |
| 6,862,495 B2 * | 3/2005 | Kahn et al. | 700/218 |
| 6,947,804 B1 * | 9/2005 | Pak et al. | 700/121 |
| 6,975,920 B2 * | 12/2005 | Kahn et al. | 700/218 |
| 7,395,129 B2 * | 7/2008 | Yamazaki et al. | 700/104 |
| 2002/0087230 A1 * | 7/2002 | Kahn et al. | 700/218 |
| 2004/0080897 A1 * | 4/2004 | Kodama et al. | 361/234 |
| 2004/0176873 A1 * | 9/2004 | Kim | 700/231 |

FOREIGN PATENT DOCUMENTS

| | | |
|---|---|---|
| JP | 9-81603 | 3/1997 |
| JP | 2002-171097 | 6/2002 |
| JP | 2003-188591 A | 7/2003 |
| JP | 2004-063867 A | 2/2004 |
| JP | 2004-079712 A | 3/2004 |
| JP | 2004-128518 A | 4/2004 |
| WO | WO 0213590 A2 * | 2/2002 |
| WO | 2004/010759 A1 | 1/2004 |

* cited by examiner

| Z NUMBER | SHAPE CODE | COMPONENT NAME |
|---|---|---|
| 1 | PP | AAA |
| 2 | QQ | BBB |
| 3 | | |
| 4 | RR | DDD |
| 5 | | |

| 10 NOZZLE HEAD | FRONT SIDE | Z1 Z2 | Z3 Z4 | Z5 Z6 | Z7 Z8 | Z9 Z10 | Z11 Z12 | Z13 Z14 | Z15 Z16 | Z17 Z18 | Z19 - Z86 | Z87 Z88 | Z89 Z90 | Z91 Z92 | Z93 Z94 | Z95 Z96 |
|---|---|---|---|---|---|---|---|---|---|---|---|---|---|---|---|---|
| | REAR SIDE | Z97 Z98 | Z99 Z100 | Z101 Z102 | Z103 Z104 | Z105 Z106 | Z107 Z108 | Z109 Z110 | Z111 Z112 | Z113 Z114 | Z115 - Z182 | Z183 Z184 | Z185 Z186 | Z187 Z188 | Z189 Z190 | Z191 Z192 |
| HEAD (NOZZLE) | H1 | ○ | ○ | ○ | ○ | ○ | ○ | ○ | ○ | ○ | ○ | - | - | - | - | - |
| | H2 | - | ○ | ○ | ○ | ○ | ○ | ○ | ○ | ○ | ○ | ○ | - | - | - | - |
| | H3 | - | - | ○ | ○ | ○ | ○ | ○ | ○ | ○ | ○ | ○ | ○ | - | - | - |
| | H4 | - | - | - | ○ | ○ | ○ | ○ | ○ | ○ | ○ | ○ | ○ | ○ | - | - |
| | H5 | - | - | - | - | ○ | ○ | ○ | ○ | ○ | ○ | ○ | ○ | ○ | ○ | - |
| | H6 | - | - | - | - | - | ○ | ○ | ○ | ○ | ○ | ○ | ○ | ○ | ○ | ○ |
| | H7 | - | - | - | - | - | - | ○ | ○ | ○ | ○ | ○ | ○ | ○ | ○ | ○ |
| | H8 | - | - | - | - | - | - | - | ○ | ○ | ○ | ○ | ○ | ○ | ○ | ○ |
| | H9 | - | - | - | - | - | - | - | - | ○ | ○ | ○ | ○ | ○ | ○ | ○ |
| | H10 | - | - | - | - | - | - | - | - | - | ○ | ○ | ○ | ○ | ○ | ○ |

○ : SUCKABLE
− : NON-SUCKABLE

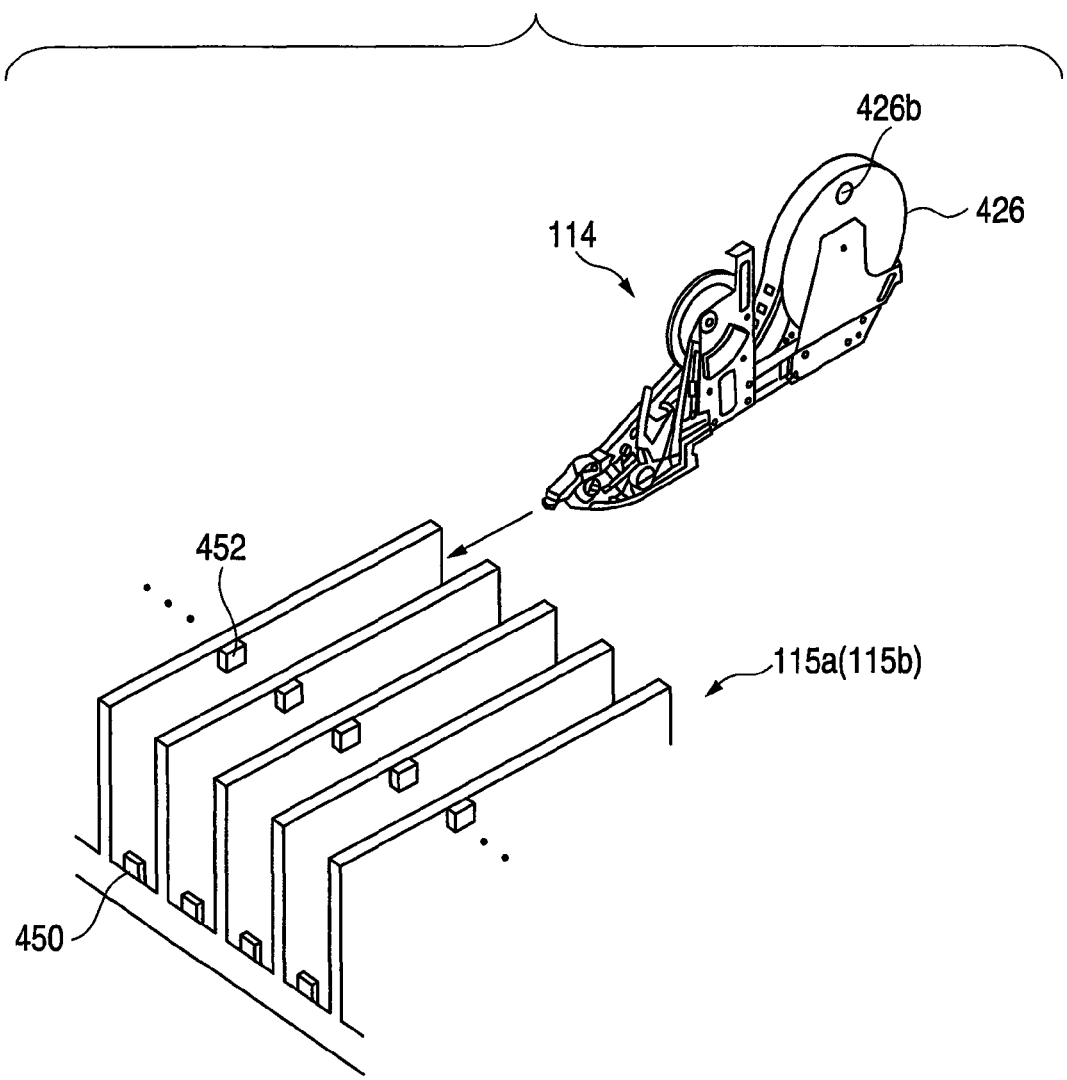

COMPONENT MOUNTING ORDER DECIDING METHOD AND COMPONENT MOUNTING ORDER DECIDING APPARATUS

TECHNICAL FIELD

This invention relates to a component mounting order deciding method and a component mounting order deciding apparatus, which target at a mounting machine etc. of electronic components and which carries out optimization of order of component mounting.

BACKGROUND ART

In the past, there is a method of preparing data of component placement in a component supply section, which realizes improvement mounting efficiency by reducing a moving distance of a mounting head, for an electronic component mounting machine with a type of receiving supply of electronic components from the component supply section fixed at a predetermined position, and of mounting electronic components on a circuit board which is disposed to a fixed position, through the use of the mounting head which is configured to be movable. By carrying out component mounting with designated component placement in accordance with data which is prepared in this manner, it becomes possible to shorten mounting time per one substrate to be produced (e.g., see, JP-A-9-81603 publication).

In case of carrying out electronic component mounting by use of the above-described component placement data preparing method, in order to start production of a substrate by an electronic component mounting machine, there is a necessity of setting components in the component supply section, along the prepared component placement data, and therefore, there is such a situation that a setting work of components is troublesome.

SUMMARY OF THE INVENTION

The invention is one which is made in view of the above-described past situation, and aims to provide a component mounting order deciding method and a component mounting order deciding apparatus, by which it is easy to change a preparatory plan and it is possible to shorten time which is required for a change of substrates to be produced.

A component mounting order deciding method of the invention is a component mounting order deciding method which targets at such a component mounting machine that a component is sucked by a mounting head which is capable of sucking a component, from an array of a plurality of component cassettes in which components were placed, and the component is placed on a substrate by moving the mounting head, and which decides mounting order of components by a computer, and is equipped with a step of obtaining component placement data to be obtained by reading identification information of the component cassette which is disposed in a component supply section, a step of preparing a component placement list in which identification information of the component cassette and a position where it is disposed in the component supply section are associated, on the basis of the component placement data, and a step of deciding mounting order of components on the basis of the prepared component placement list, in such a state that the array of the component cassettes were fixed.

By this method, it is possible to carry out optimization of mounting order even if component cassettes are placed randomly, and it is easy to change a preparatory plan, and it becomes possible to shorten time which is required for a change of substrates to be produced.

The above-described deciding method can further includes a step of reading identification information of the component cassette, from an IC tag which is disposed on the component cassette or a component tape in the component cassette, a step of specifying a position of the component cassette, from position information which is received from the IC tag, and a step of preparing a component placement list, on the basis of the specified position of the component cassette and identification information which is read.

The step of deciding mounting order can include a step of referring to mounting point information including information regarding positions of components to be mounted on the substrate, to change mounting order regarding those mounting points, and a step of calculating mounting time under the changed mounting order, to obtain mounting order by which the mounting time becomes shorter. By this method, mounting order, by which mounting time is shortened more, is obtained, and therefore, it is possible to shorten substrate production time.

In addition, in case that the mounting head has a plurality of nozzles, the step of deciding mounting order includes a step of preparing a histogram which shows a relation of components to be mounted and the number of the components, on the basis of the array of the component cassettes, a step of deciding a component cassette which includes components whose number is the largest, with reference to the histogram, and a step of deciding a component which can be sucked, at the same time of absorption of a component from the decided component cassette, and the mounting order is decided on the basis of the decided component cassette and a component which can be sucked.

In addition, the component mounting order deciding method can be further equipped with a step of judging whether deficient components exist or not, after the component cassette is set to the component supply section, a step of announcing a warning when it is judged that deficient components exists, and a step of judging whether a component cassette, which includes the deficient components, is set to the component supply section or not, after the announcing step.

In addition, in the step of judging whether deficient components exist or not, when it became clear that a plurality of component cassettes which contain same components, any one of the following steps can be carried out: 1) components are sucked on a preferential basis from any one component cassette among the plurality of component cassettes, and components in other component cassettes are treated as spare components at the time of shortage of components, or 2) mounting points on the substrate are allocated with respect to each of the plurality of component cassettes.

In addition, in the step of judging whether deficient components exist or not, in case that there exit substitute components for a component cassette, the substitute components are treated as components to be mounted on the substrate.

In addition, in case that a plurality of component mounting machines exist on a production line of the substrate, the step of judging whether deficient components exist or not is carried out as to all of the plurality of component mounting machines.

In addition, the invention provides a component mounting order deciding program which has a computer executed each step of the above-described component mounting order deciding method.

By this program, it is possible to carry out optimization of mounting order even if component cassettes are placed randomly, and it is easy to change a preparatory plan, and it becomes possible to shorten time which is required for a change of substrates to be produced.

In addition, the invention provides a computer readable recording medium on which the above-described component mounting order deciding program is recorded.

A component mounting order deciding apparatus of the invention is a component mounting order deciding apparatus which targets at such a component mounting machine that a component is sucked by a mounting head which is capable of sucking a component, from an array of a plurality of component cassettes in which components were placed, and the component is placed on a substrate by moving the mounting head, and which decides mounting order of components by a computer, and is equipped with a reading data obtaining section which obtains component placement data to be obtained by reading identification information of the component cassette which is disposed in a component supply section, component placement list preparing section which prepares a component placement list in which identification information of the component cassette and a position where it is disposed in the component supply section are associated, on the basis of the component placement data, and a mounting order deciding section which decides mounting order of components on the basis of the prepared component placement list, in such a state that the array of the component cassettes were fixed.

By this configuration, it is possible to carry out optimization of mounting order even if component cassettes are placed randomly, and it is easy to change a preparatory plan, and it becomes possible to shorten time which is required for a change of substrates to be produced.

A component mounting machine of the invention is equipped with the above-described component mounting order deciding apparatus, and a control section which mounts components on a substrate by the component mounting order which is decided by the component mounting order deciding apparatus.

In addition, a component mounting apparatus of the invention is equipped with a component supply section in which a plurality of component cassettes which contain components are placed, a mounting head which sucks a plurality of components from the component supply section, and mounts the plurality of sucked components on a substrate, a control section which controls an operation of the mounting head, and a histogram obtaining section which obtains a histogram which is obtained on the basis of an array of the cassettes to be disposed in the component supply section and which shows a relation of components to be mounted and the number of the components, and the control section controls the mounting head so as to decide a component cassette which includes components whose number is the largest, with reference to the histogram, and to suck components which can be sucked from another component cassette at the same time of sucking components from the decided component cassette, and the control section decides mounting order of components on the basis of components which were sucked by the mounting head.

A restriction condition judging method of the invention is a restriction condition judging method which targets at such a component mounting machine that a component is sucked by a mounting head which is capable of sucking a component, from an array of a plurality of component cassettes in which components were placed, and the component is placed on a substrate by moving the mounting head, and which decides mounting order of components by a computer, and is equipped with a step of obtaining component placement data to be obtained by reading identification information of the component cassette which is disposed in a component supply section, a step of preparing a component placement list in which identification information of the component cassette and a position where it is disposed in the component supply section are associated, on the basis of the component placement data, a step of judging whether the array of cassettes violates a restriction condition, on the basis of the component placement list and the restriction condition regarding restriction of placement position of components of the component mounting machine, and a step of announcing a warning in case that the array of the component cassettes violates the restriction condition.

In the above-described restriction condition judging method, the step of judging whether the component array violates the restriction condition includes a step of judging whether the mounting head is capable of sucking components of the component cassette or not, from a relation of the mounting head and a set position of the component cassette.

Further, a component mounting order deciding method of the invention is a component mounting order deciding method which targets at such a component mounting machine that a component is sucked by a mounting head having a plurality of nozzles, which is capable of sucking a component, from an array of a plurality of component cassettes in which components were placed, and the component is placed on a substrate by moving the mounting head, and which decides mounting order of components by a computer, and is equipped with a step of obtaining component placement data to be obtained by reading identification information of the component cassette which is disposed in a component supply section, a step of preparing a component placement list in which identification information of the component cassette and a position where it is disposed in the component supply section are associated, on the basis of the component placement data, a step of deciding a nozzle which sucks components from the plurality of nozzles so as to satisfy a restriction condition, on the basis of the component placement list and the restriction condition regarding restriction of placement positions of components of the component mounting machine, and a step of deciding component mounting order on the basis of the nozzles which suck the components.

According to the invention, it is possible to provide a component mounting order deciding method and a component mounting order deciding apparatus, by which it is easy to change a preparatory plan, and it is possible to shorten time which is required for a change of substrates to be produced.

BRIEF DESCRIPTION OF THE DRAWINGS

FIG. 20 is a view for explaining a configuration of a component supply section in an example which used IC tags, in more detail.

BEST MODE FOR CARRYING OUT THE INVENTION

Hereinafter, embodiments of the invention will be described in detail by use of drawings. Firstly, a component mounting machine, which is targeted by a component mounting order optimizing method (component mounting order deciding method) and a component mounting order optimizing apparatus (component mounting order deciding apparatus) as embodiments of the invention, will be described.

As the component mounting machine which is targeted by the component mounting order optimizing apparatus as an embodiment of the invention (hereinafter, optimizing apparatus), various forms can be cited. For example, there are a type of mounting components while a component supply section and a substrate are moved and a mounting head is rotated (hereinafter, rotary machine), a type of mounting components while a mounting head moves in XY directions, which corresponds to mounting of relatively large size electronic components, irregular shape components, IC components, etc. (hereinafter, multiple function machine), a type of mounting components while a mounting head having a plurality of nozzles moves in XY directions (hereinafter, modular machine), and so on. Meanwhile, in the embodiment of the invention, a case of using the modular machine as a component mounting machine will be described.

Figure 15:
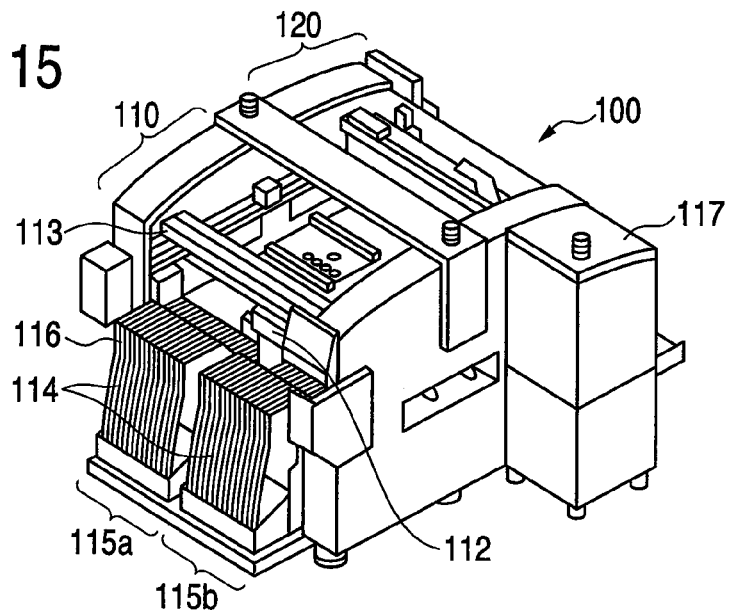
FIG. 15 is an external appearance view of a component mounting machine which relates to the embodiment of the invention.

FIG. 15 is an external appearance view of a component mounting machine which relates to the embodiment of the invention. As shown in FIG. 15, a component mounting machine 100 is equipped with two sub units (a front sub unit 110 and a rear sub unit 120) which carry out component mounting simultaneously and independently, or in a mutually coordinated manner (or, by an alternate operation).

Each sub unit 110, 120 is of an orthogonal robot type mounting stage, and is equipped with 2 component supply sections 115a and 115b which contain component tapes, e.g., have an array of maximum 48 component cassettes 114, a multi-mounting head 112 having 10 absorption nozzles (10 nozzle head) which can suck, for example, maximum 10 components from those component cassettes 114 and mount them on a substrate 20 (hereinafter, also simply referred to as "nozzle"), an XY robot 113 which moves the multi-mounting head 112, a component recognition camera 116 for inspecting an sucked state of a component which is sucked by the multi-mounting head 112 in two dimensions or in three dimensions, and a tray supply section 117 which supplies a tray component.

Figure 16:
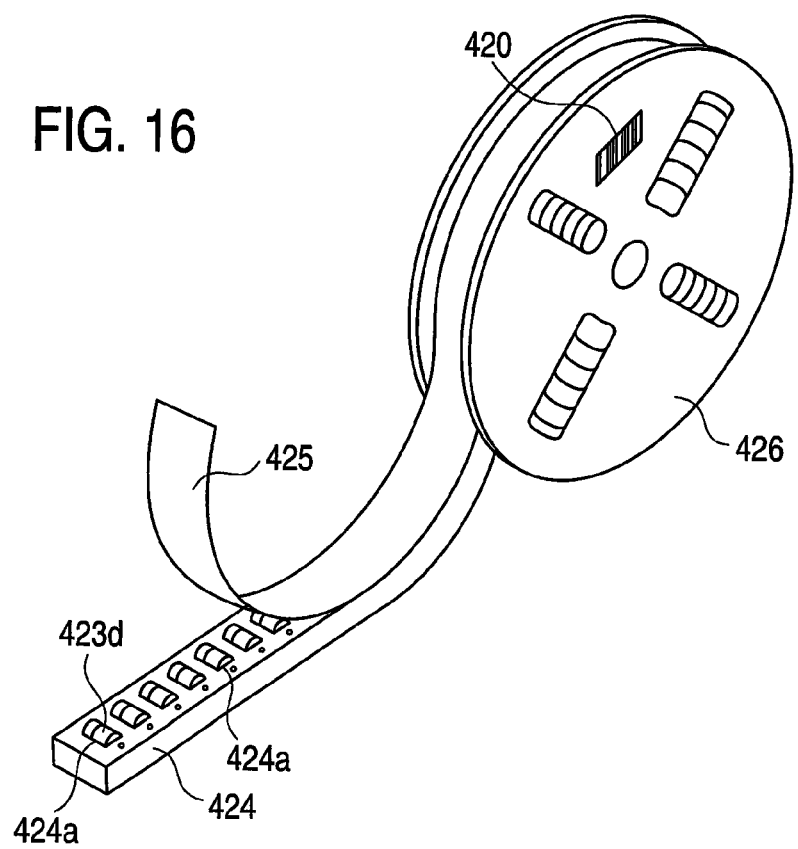
FIG. 16 is a view showing a supply reel which is used for a component cassette, which relates to the embodiment of the invention.

FIG. 16 is a view showing a supply reel which is used for a component cassette, which relates to the embodiment of the invention. As shown in FIG. 16, electronic components 423d are placed in storage concave portions 242a which were formed continuously at uniform intervals in a carrier tape 424, and a cover tape 425 is attached to this top surface to be packed, and it is supplied as such a taping form (component tape) that a given amount of them were wound around a supply reel 426. To this supply reel 426, attached is a bar code 420 which shows information such as a name of components which are stored, the number of components which are stored.

Meanwhile, as identification information which shows name etc. of components which are stored in the component cassette 114, it is not limited to a bar code, but it is possible to utilize various identification information such as non-contact IC chips and RFID tags. This will be described later.

When the component cassette 114 having the supply reel 426 is loaded in the component supply section 115, the carrier tape 424 is pulled out into an inside of the component mounting machine 100. Then, at the time of component mounting, the carrier tape 424 is fed in such a state that the cover tape 425 is peeled off, according to need, and the chip type electronic component 423d, which is stored in the storage concave portion 424a, is sucked by the mounting head, and thereby, it is taken out.

Figure 17:
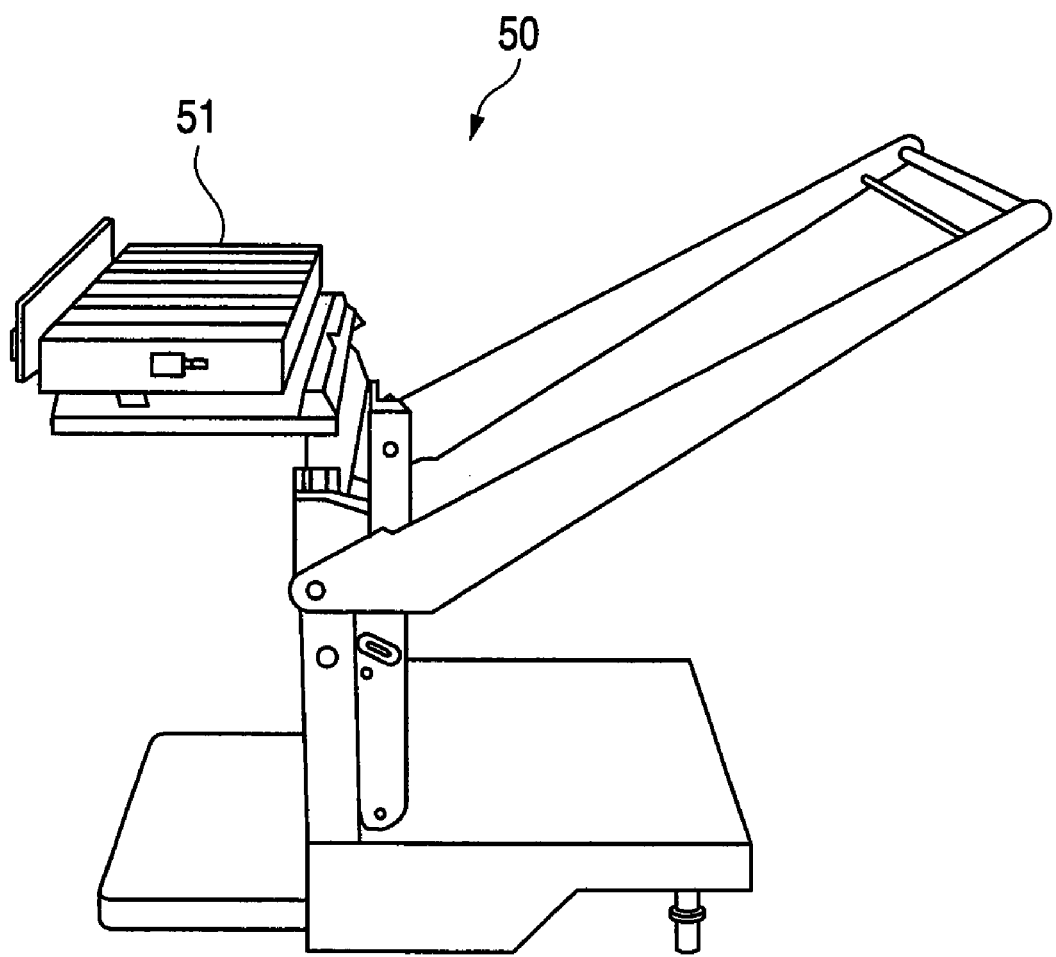
FIG. 17 is an external appearance view for explaining a package replacement card which relates to the embodiment of the invention.

FIG. 17 is an external appearance view for explaining a package replacement card which relates to the embodiment of the invention. A package exchange cart 50, which is shown in FIG. 17, has a component placement section 51 in which a plurality of component cassettes 114 can be allocated. Then, in such a state that the component cassettes 114 were allocated, it is inserted into the component supply section 115 of the component mounting machine 100, and thereby, it is possible to dispose the plurality of component cassettes 114 to the component mounting machine 100 at one time.

Figures 18A, 18B:
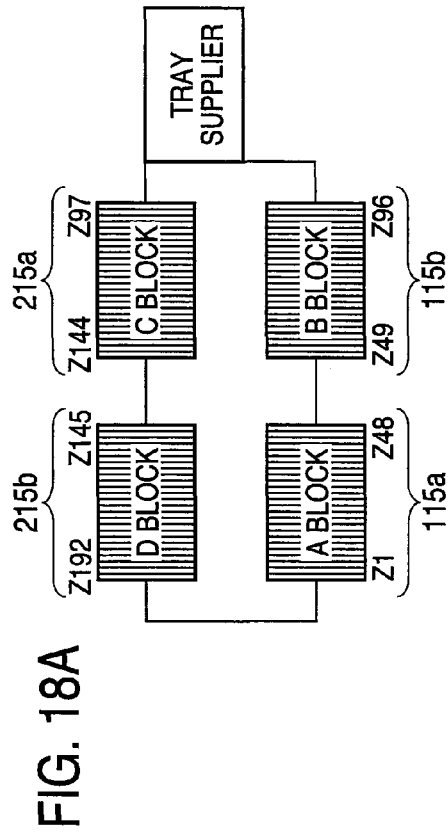
FIG. 18 is a view which shows a restriction condition of component placement of a component mounting machine.

FIG. 18 is a view which shows a restriction condition of component placement of a component mounting machine, and FIG. 18(a) shows a concrete configuration example of the component supply sections 115a,b and 215a,b of respective sub units 110 and 120, and FIG. 18(b) shows a table which shows the number of various component cassettes 114 to be mounted and positions on a Z axis in that configuration. As shown in FIG. 18(a), each component supply section 115a, 115b, 215a, 215b can mount maximum 48 component tapes (respective positions are Z1 through Z48, Z49 through Z96, Z97 through Z144, Z145 through Z192).

Concretely speaking, as shown in FIG. 18(b), by using a double cassette which contains 2 component tapes with tape width of 8 mm, it is possible to load maximum 48 kinds of components in each component supply section (A block through D block). As components (component cassette) are of larger tape width, the number of cassettes which can be loaded in one block is reduced. Meanwhile, left side component supply sections 115a, 215a (A block, C block) toward each sub unit are also called as "left block", and right side component supply sections 115b, 215b (B block, D block) toward each sub unit are also called as "right block".

Here, when a component cassette with large tape width is disposed to an end portion of each block of a component supply section, the component cassette protrudes significantly from that component supply section. Therefore, disposed is such restriction that the component cassette with large tape width can not be attached to an end portion of each block. In FIG. 18(b), "O" shows attachable, and "-" shows non-attachable. For example, disposed is such restriction that a component cassette with tape width of 44 mm or more can not be attached to positions of Z1 and Z47 which are end portions of the block A.

FIG. 19 is a view which shows an example of a position (Z axis) of a nozzle head suckable component supply section, and a view and a table which show an example of a position (Z axis) of a 10 nozzle head suckable component supply section. Meanwhile, H1 through 10 in the figure point out (positions of) nozzles which were mounted on the 10 nozzle head. Here, an interval of each nozzle of the 10 nozzle head corresponds to a width (21.5 mm) of one double cassette, and therefore, a Z number of a component which is sucked by one time up and down movement becomes alternate (only odd numbers or even numbers).

Figures 19A, 19B:
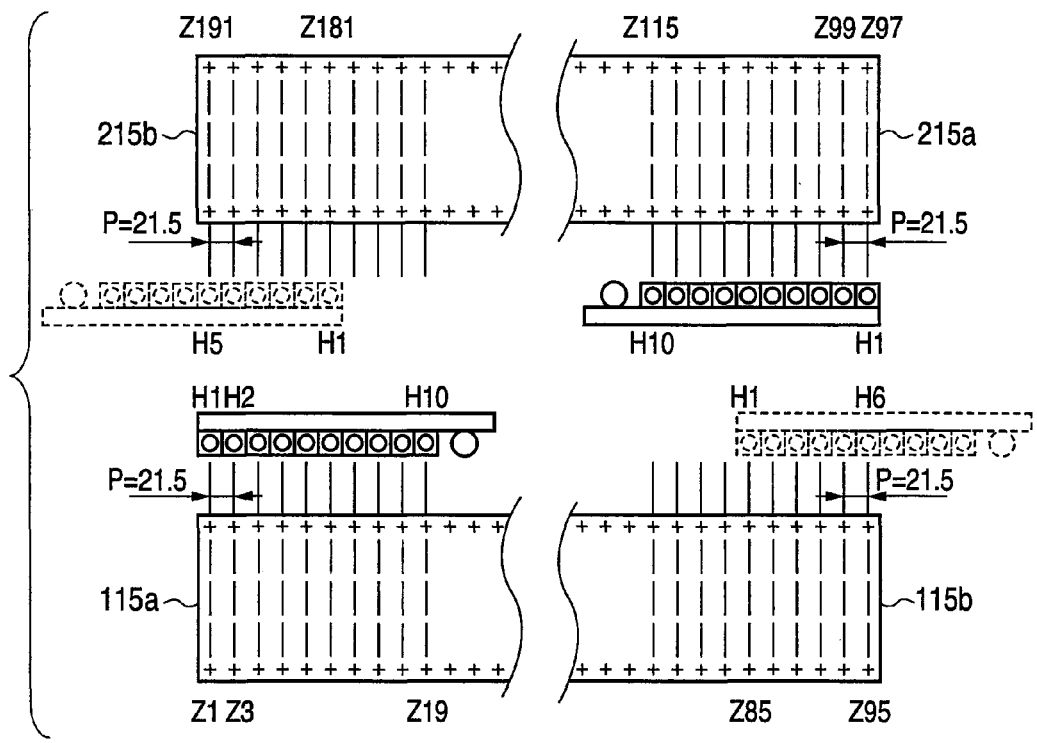
FIG. 19 is a view which shows an example of a position (Z axis) of a nozzle head suckable component supply section.

In addition, by movement restriction in a Z axis direction of the 10 nozzle head, as shown in FIG. 19(b), there exist nozzles ("-" in the figure) which can not suck, to components (Z axis) which configure one end of each component supply section. In this manner, in the component mounting machine 100, disposed is restriction condition regarding component array positions in the component supply section, and positions where components are mounted.

First Embodiment

In a first embodiment of the invention, aimed is optimization of such component mounting order that, in the component mounting machine as described above, even if a user arrays components cassettes randomly and sets them to the component mounting machine, mounting time becomes minimum while a state of the array is fixed. By this means, it is possible to prepare optimum component array data, and to save trouble of setting components exactly along the data.

Figure 1:
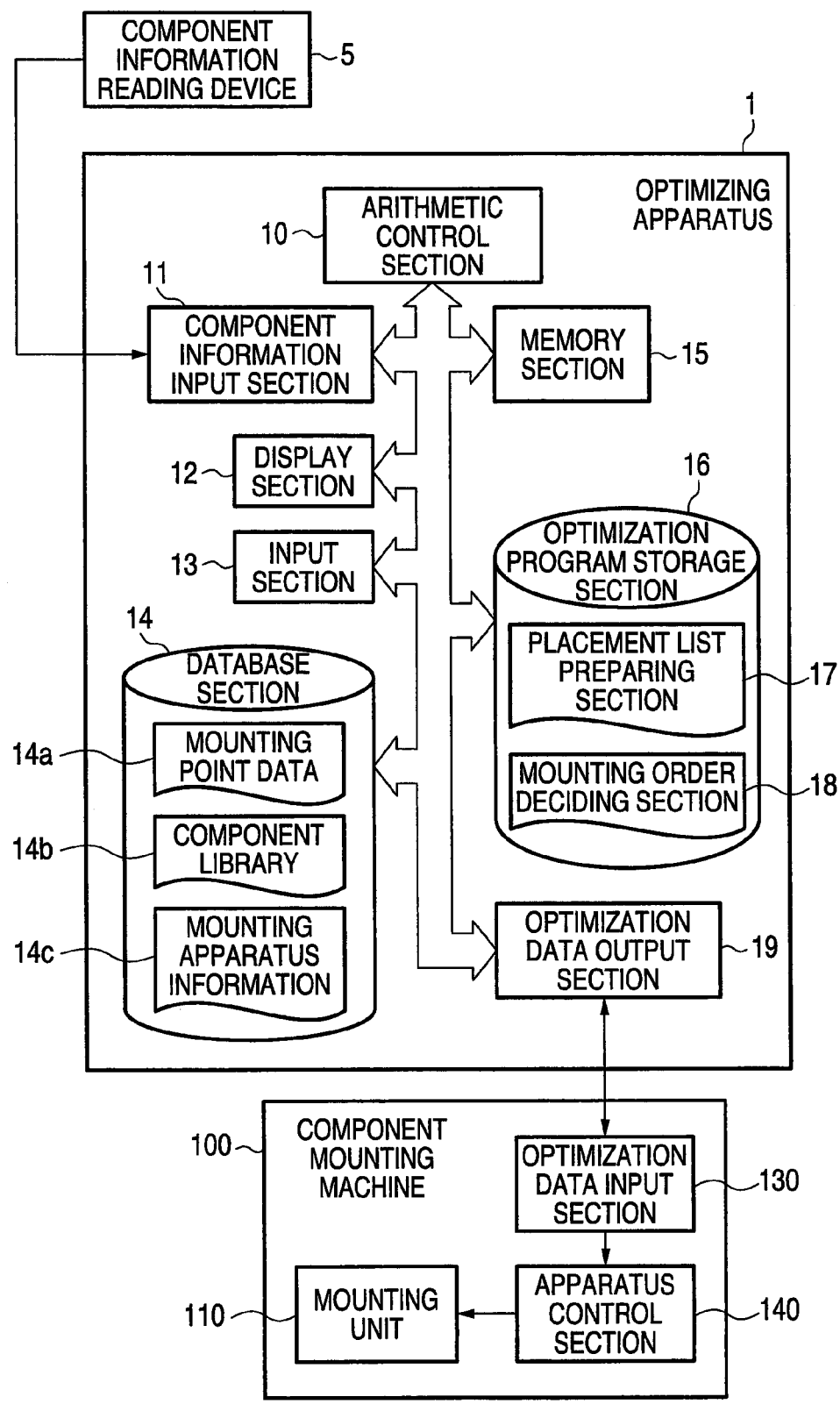
FIG. 1 is a block diagram which shows a schematic configuration of an optimizing apparatus which relates to a first embodiment of the invention.

FIG. 1 is a block diagram which shows a schematic configuration of an optimizing apparatus which relates to the first embodiment of the invention. As shown in FIG. 1, an optimizing apparatus 1 of the first embodiment is equipped with an optimization program storage section 16 which includes an arithmetic control section 10, a component information input section 11, a display section 12, an input section 13, a database section 14, a memory section 15, a placement list preparing section 17 and a mounting order deciding section 18, and an optimization data output section 19.

The arithmetic control section 10 is CPU, a numerical processor etc., and loads a program necessary for the memory section 15, from the optimization program storage section 16, in accordance with an instruction etc. from a user, and executes the same, and controls each constituent element of the optimizing apparatus 1, in accordance with that execution result.

To the component information input section 11, component placement information, which is read by a component information reading device 5, is inputted. A type of the component information reading device 5 is not particularly limited, but here, the component information reading device 5 is configured by a bar code reader which reads information of a bar code 420 which is described in FIG. 16 and is disposed on the supply reel 426. In addition, in lieu of the bar code 420, it is possible to adopt an IC (Integrated Circuit) tag including the above-described non-contact IC chip and RFID tag etc. In this case, the component information reading device 5 is configured by an IC tag reader/writer 111 (FIG. 21) which reads identification information for identifying a component stored in the IC tag.

FIG. 20 is a view for explaining component supply sections 115a and 115b which used IC tags, in more detail. The component cassette 114 is equipped with a supply reel 426 which has an IC tag 426b in lieu of the bar code 420 of FIG. 16. In the component supply sections 115a and 115b, switches 450 and seam detection sensors 452 are disposed with respect to each Z number along Z axis.

The switch 450 is a switch (sensor) which is electrically turned ON when the component cassette 114 is loaded in the component supply section 115a (115b). On the basis of an output from the switch 450, the IC tag reader/writer 111 can know a Z number of the component supply section 115a (115b) in which the component cassette 114 is loaded. The seam detection sensor 452 is a sensor which optically detects seams of the carrier tape 424. At the time of component mounting, before an end point of a carrier tape as an object to be mounted disengages, the end point is connected to a start point of another carrier tape. By the suchlike connection, it becomes possible to realize component filling-up without stopping the component mounting machine 100.

Meanwhile, as shown in FIG. 20, in case that the switch 450 is disposed, it is detected by that switch 450 that the component cassette 114 is loaded in the component supply section 115a (115b). Therefore, it is all right even if Z number of the component cassette 114 is specified on the basis of a detection result of the switch 450.

Figure 21:
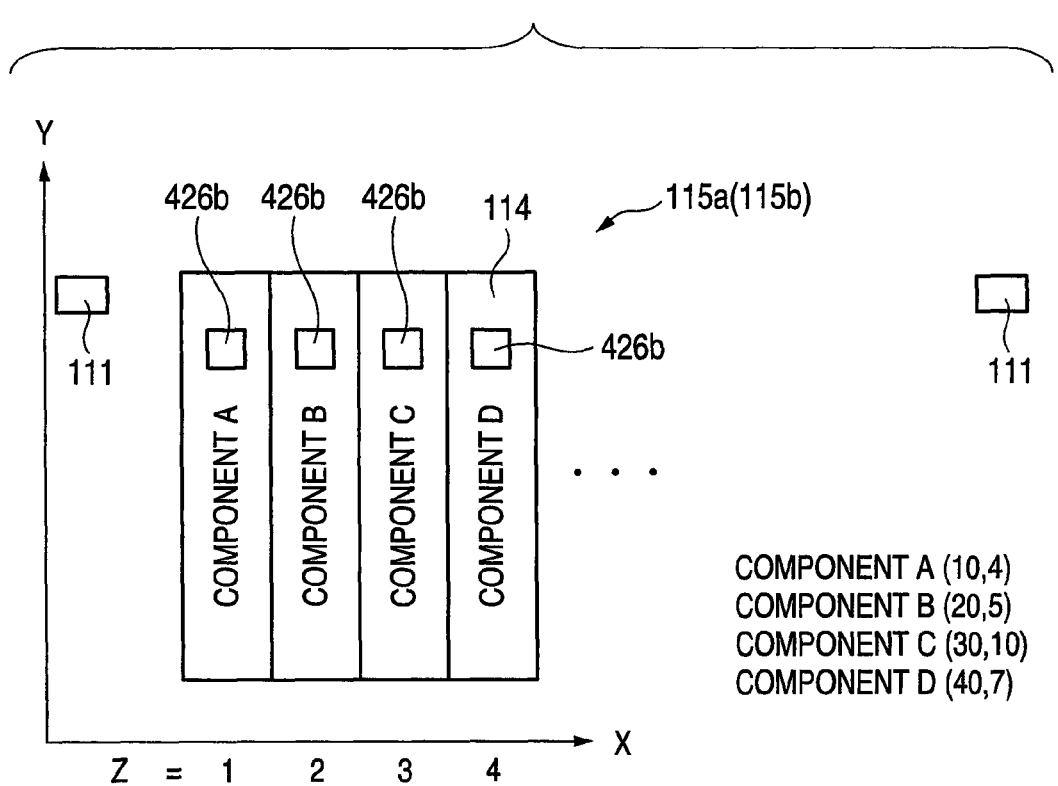
FIG. 21 is a view for explaining a method of specifying a Z number of a carrier tape by the same IC tag as above.

Irrespective of the switch 450 as show in FIG. 20, FIG. 21 is a view for explaining a method of specifying a Z number of the carrier tape 424 by an IC tag. Two IC tag readers/writers 111, which configure a component reading device, specify a position of each IC tag 426b, on the basis of a direction of an electromagnetic wave which is received by each IC tag 426b. When a position of the IC tag 426b is specified, its Z number is specified. On that occasion, two IC tag readers/writers 111 receives information of a component name of each IC tag 426b, and therefore, on the basis of information which is received from the IC tag 426b, a component name and a Z number of the component cassette 114 are specified. For example, in case of assuming that the Z number increases one at a time as X increases 10 at a time as shown in the figure, when a position of a component A is specified to be (X, Y)=(10, 4), it is found by X coordinate that Z number of the component A is 1. Meanwhile, in case of a double cassette, two component tapes are to exist at the same Z position, but X coordinates of components are different, and therefore, it becomes possible to judge whether it is a component tape which is located on the left side, or a component tape which is located on the right side, of the double cassette.

Meanwhile, as a method of specifying a position of the IC tag 426b, it is not limited to one by a direction of an electromagnetic wave, but it may be ones by strengths of electromagnetic waves which two IC tag readers/writers 111 receive, and a ratio of strengths of electromagnetic waves. Further, in case that the IC tag 426b is outputting a signal by use of electromagnetic waves, infrared rays etc. as a wireless communication medium, it is all right even if a position of the IC tag 426b is specified on the basis of a signal output state such as its strength and direction.

In addition, the number of IC tag readers/writers is not necessary two, but it may be one, if it is possible to judge a position of the IC tag 426b from a strength and a direction of electromagnetic waves to be received.

Figure 22:
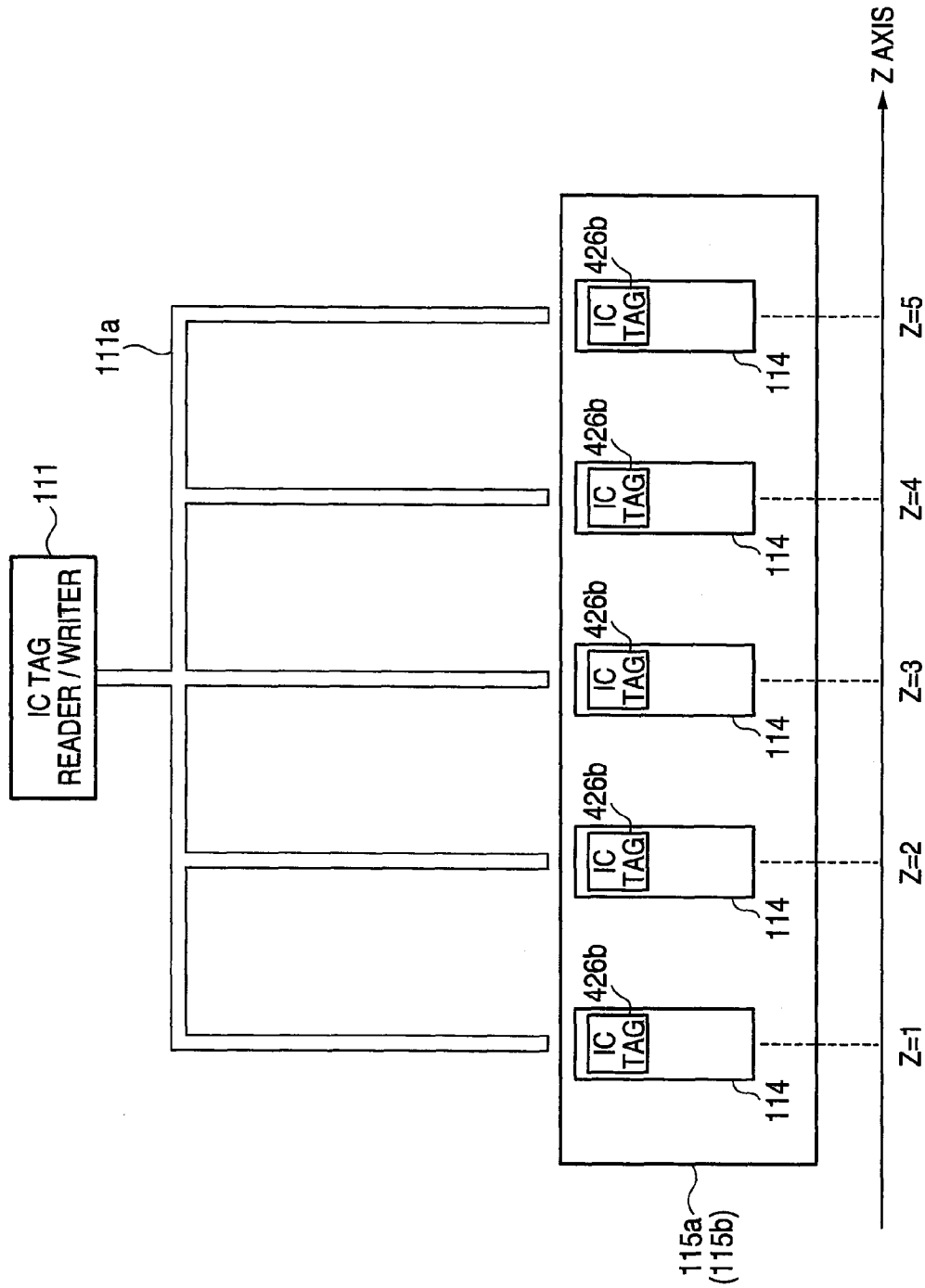
FIG. 22 is an explanatory view for explaining such an appearance that the same one tag reader/writer as above specifies a position of the IC tag.

FIG. 22 is an explanatory view for explaining such an appearance that one tag reader/writer 111 specifies a position of the IC tag 426b. For example, the component mounting machine 100 is equipped with one IC tag reader/writer 111, an antenna 111a which is disposed from the IC tag reader/writer 111 to the vicinity of the IC tag 426b of each component cassette 114 in the component supply sections 115a, 115b.

In this manner, the antenna 111a exists up to the vicinity of each IC tag 426b, and thereby, the IC tag reader/writer 111 can surely receive electromagnetic waves of the IC tag 426b. That is, the IC tag reader/writer 111 can precisely specify a position of each IC tag 426b, on the basis of an electromagnetic wave strength and receiving direction of each IC tag 426b, which is its reception result. Furthermore, the IC tag reader/writer 111 can precisely specify Z number of the component cassette 114 from its position.

In addition, it is all right even if an antenna, which reaches up to the vicinity of the IC tag 426b, is disposed with respect to each IC tag 426b. In this case, each antenna corresponds to each Z number (Z=1, 2, . . . ) and therefore, the IC tag reader/writer 111 switches and obtains an output of each antenna, and thereby, it specifies Z number of the IC tag 426b (component cassette 114) which corresponds to an antenna which is switched, and obtains component information from that IC tag 426b.

That is, a switch is disposed on each antenna, and that switch is turned ON, and thereby, an output of an antenna which corresponds to that antenna is obtained by the IC tag reader/writer 111. The IC tag reader/writer 111 turns ON each switch in sequence, in such a manner that it turns ON only a switch of an antenna which corresponds to Z=1, among switches which corresponds to respective antennas, and then, turns ON only a switch of an antenna which corresponds to Z=2, and thereby, it switches and obtains an output of each antenna.

The display section 12 is CRT, LCD etc., and the input section 13 is a keyboard, a mouse etc., and these are used for interaction etc. of the optimizing device 1 and an operator, under control by the arithmetic control section 10.

The database section 14 is configured to have a hard disc etc. which stores input data (mounting point data 14a, component library 14b and mounting device information 14c) to be used for optimization processing, and mounting point data etc. generated by optimization.

The mounting point data 14a is an aggregation of information showing mounting points of components which become objects of mounting. Information showing one mounting point has control data such as component types (component names), X coordinates, Y coordinates, restriction information regarding mounting of components (a type of an absorption nozzle which can be used, maximum moving speed of the multi-mounting head 112).

The component library 14b is a library in which collected is unique information as to each component type which can be handled by the component mounting machine 100, and has component size with respect to each component type, tact (tact unique to a component type under a certain condition), other restriction information (a type of an absorption nozzle which can be used, a recognition system by the component recognition camera 116, a maximum speed ratio of the multi-mounting head 112, etc.) and so on.

The mounting apparatus information 14c is information which shows a device configuration with respect to each of all sub units which configure a production line, the above-described restrictions etc., and has head information regarding a type etc. of a multi-mounting head, nozzle information regarding a type etc. of an absorption nozzle which can be sucked by a multi-mounting head, cassette information regarding a maximum number etc. of the component cassette 114, tray information regarding the number of stages of trays which are contained in the tray supply section 117, and so on.

The memory section 15 is configured to have RAM etc. which provide a work region by the arithmetic control section 11.

The optimization program storage section 16 is configured to have a hard disc etc. which store various optimization programs for realizing a function of the optimizing device 1. The optimization program storage section 16 includes a placement list preparing section 17, and a mounting order deciding section 18.

The optimization data output section 19 outputs optimization data which is obtained by the optimization program. As a form of the optimization data output, it is all right even if it is connected to the optimization data input section 130 of a component mounting machine with wires or without wires to transmit optimization data, and the optimization data is recorded on a recording medium, through which it is outputted.

The component mounting machine 100 is equipped with an optimization data input section 130 to which optimization data is inputted, a mounting machine control section 140 which controls a work head, an absorption nozzle, etc. of a mounting unit 110, in accordance with the inputted optimization data.

Figure 2:
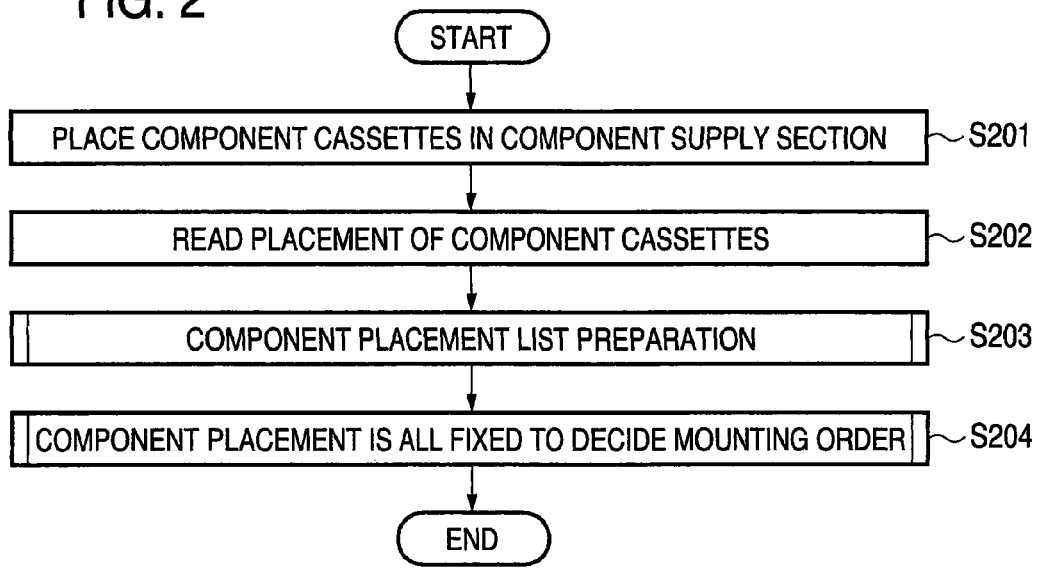
FIG. 2 is a flow chart which shows an optimizing method which relates to the first embodiment.
Figures 4, 5:
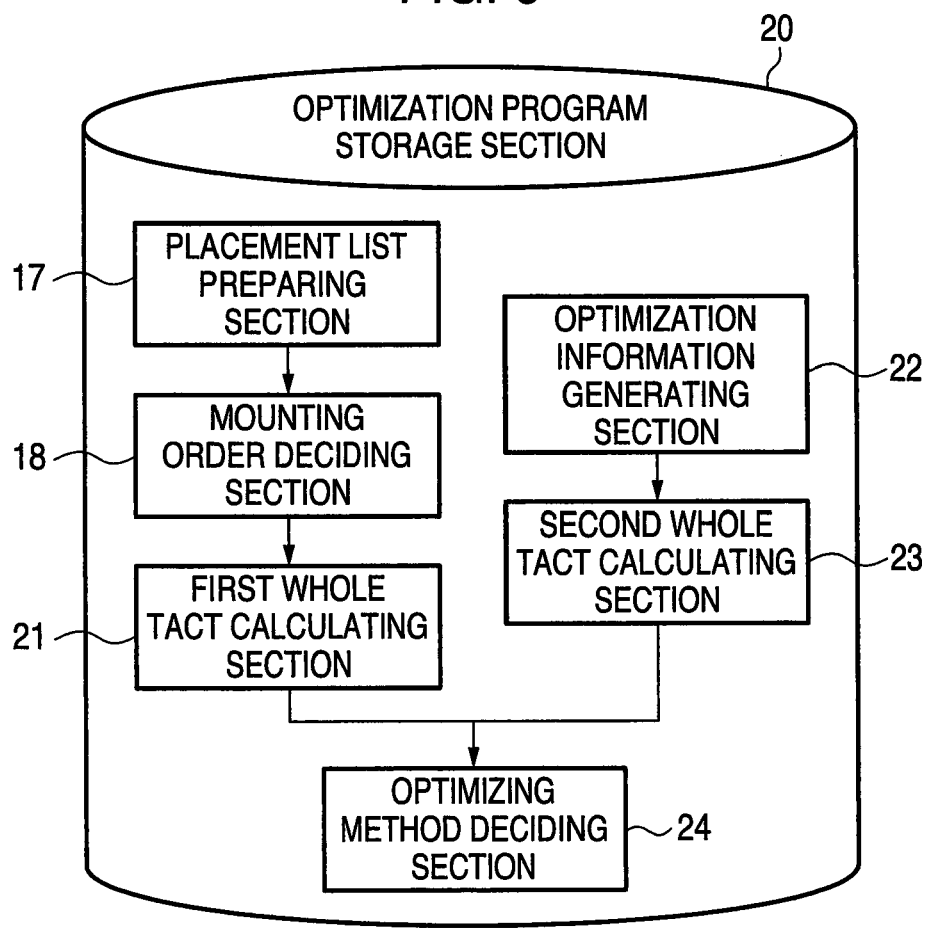
FIG. 4 is an explanatory view which shows an example of a placement list.
FIG. 5 is a block diagram which shows a hardware configuration of an optimization program storage section in an optimizing apparatus which relates to the second embodiment of the invention.

A component mounting order optimizing method by a component mounting machine with the above-described configuration will be hereinafter described. The method of this embodiment is one for carrying out optimization of mounting order from an array of component cassettes which were placed randomly FIG. 2 is a flow chart which shows an optimizing method which relates to the first embodiment. As shown in FIG. 2, a user sets a component cassette in the component supply section 115 (S201). Then, identification which is attached to the placed component cassette is read by the component information reading device 5 (S202). Then, component information, which is read out, is inputted to the component information input section 11, and the placement list preparing section 17 prepares a component placement list showing what kind of components (component cassette) are set to which position (Z number) of the component supply section (s203). The component placement list has at least Z numbers, and corresponding component names thereof, and includes shape codes etc. according to need, as shown in FIG. 4.

As to preparation of the component placement list in S203, in case that the component information reading device 5 is a bar code reader, a position to be read (Z number) is displayed on a display section of the bar code reader, to read a bar code of a component cassette which is set to a pertinent Z number thereof. In this manner, association of Z numbers and components is carried out, and the component placement list is prepared.

Figure 23:
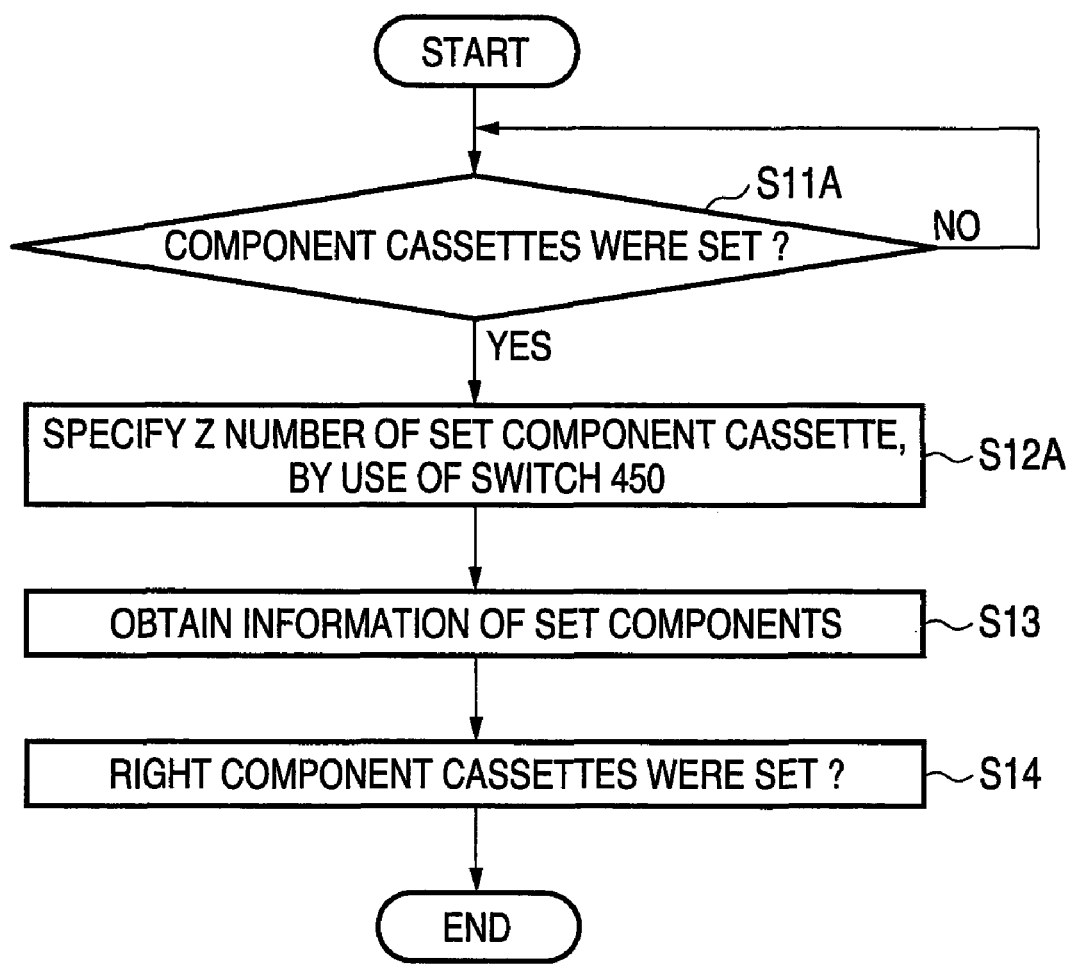
FIG. 23 is a flow chart of the same component verification processing as above.

On the other hand, in case that the component information reading device is an IC tag reader (IC tag reader/writer 111), processing shown in FIG. 23 is carried out, in the preparation process S203 of the component placement list. The optimizing apparatus 1 investigates whether the component cassette 114 in which a component tape is stored is set in the component supply sections 115a and 115b, on the basis of an output of the switch 450, by use of the IC tag reader/writer 111 which configures the component information reading device 5 (S11A). In case that the component cassette 114 is newly set in the component supply sections 115a and 115b (YES in S11A), a Z number of the component cassette 114 which is set is specified by the output of the switch 450 (S12A). After that, one IC tag reader/writer 111 obtains component information from an IC tag 426b of the component tape which is set (S13).

The arithmetic control section 10 prepares a component placement list based on the set component tape (S14). That is, The arithmetic control section 10 prepares a component placement list based on a component name and a unit ID of the set component tape and z number specified in the (S13).

In preparing processing of the component placement list shown in FIG. 23, specification of a Z number of the component cassette 114 is carried out on the basis of an output of the switch 450. On this account, in case of a double cassette, it is not possible to precisely specify a position of each component tape. In addition, also in case that a plurality of component cassettes were set simultaneously in a lump, it is not possible to specify a position of each component tape. On this account, it is all right even if it is configured in such a manner that a position of each component tape is specified by use of the IC tag reader/writer 111, as shown in FIG. 24.

Figure 24:
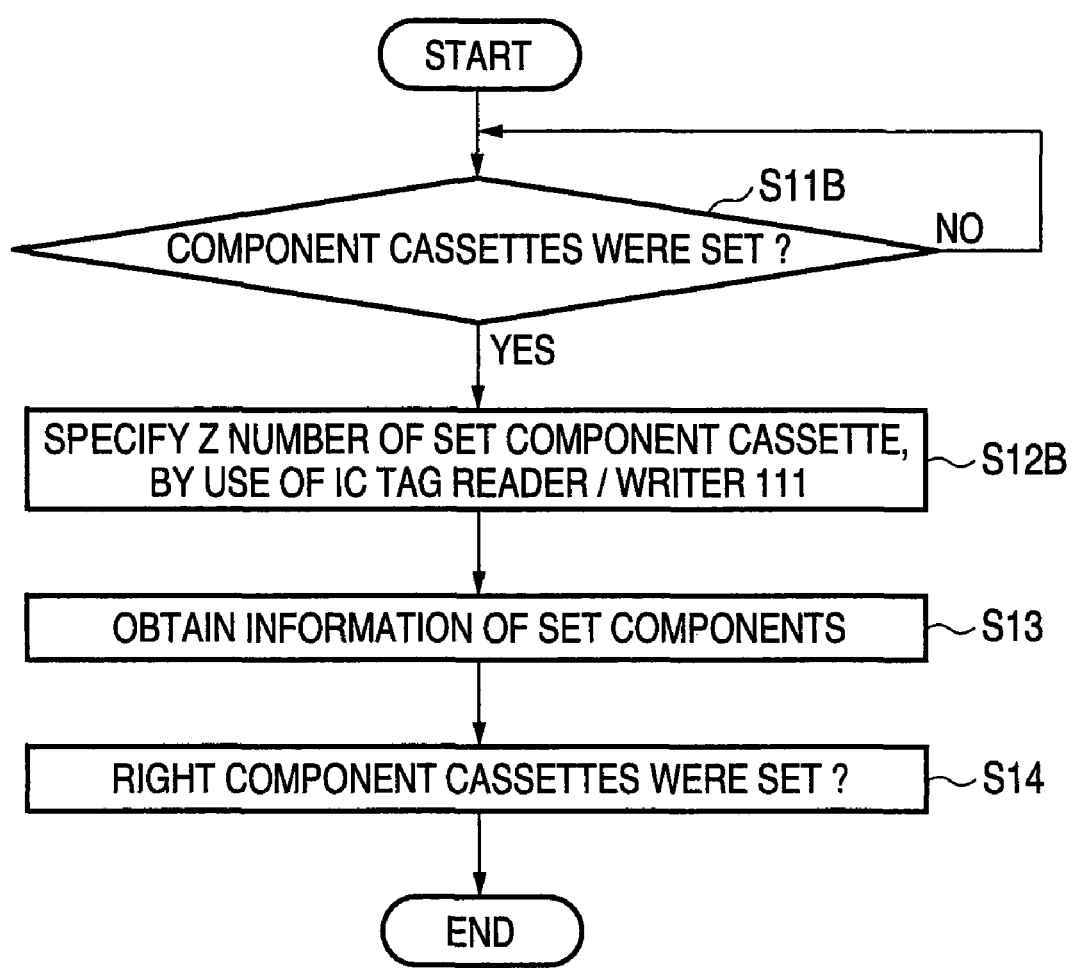
FIG. 24 is a flow chart of a modified example of the same component verification processing as above.

FIG. 24 is a flow chart of a modified example of preparing processing of the component placement list shown in FIG. 23. The optimizing apparatus 1 investigates whether the component cassette 114 in which a component tape is contained is set in the component supply sections 115a and 115b or not, by use of two IC tag readers/writers 111 (S11B). That is, by investigating a position of the IC tag 426b by two IC tag readers/writers 111, as described with reference to FIG. 21, a position of the component cassette 114 to which the component tape attached with the IC tag 426b is set, is investigated. In case that the component cassette 114 is newly set in the component supply sections 115a and 115b (YES in S11B), Z number of the set component cassette 114 is specified by the two IC tag readers/writers 111 (S12B). As to subsequent processing, it is the same as one shown in FIG. 23, and therefore, detailed explanations thereof will not be repeated here. Meanwhile, by using the two IC tag readers/writers 111, it is also possible to investigate whether information, which is contained in any one of a left side cassette and a right side cassette, coincides or not, in case of a double cassette. In addition, the switch 450 does not become indispensable.

Returning to FIG. 2, in such a state that component placement is all fixed, mounting order is optimized, and determined (S204). That is, in an optimizing method of this embodiment, mounting order is optimized without any change of an array placed in the component supply section 115. Therefore, even if a user places the component cassettes 114 in the component supply section 115 randomly, it becomes possible to carry out component mounting with optimized mounting order in that placement.

Figure 3:
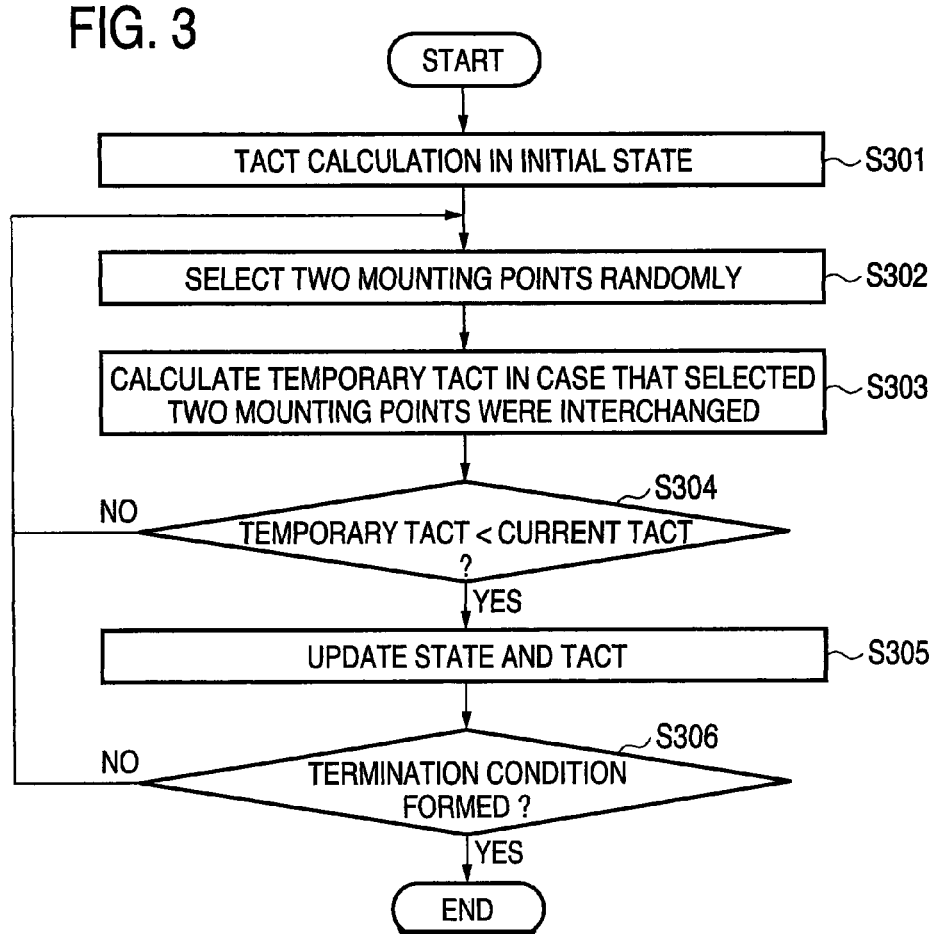
FIG. 3 is a flow chart which shows a mounting order deciding method which relates to the first embodiment.

FIG. 3 is a flow chart which shows a mounting order deciding method which relates to the first embodiment. Meanwhile, FIG. 3 is a view which shows such an appearance that two mounting points are interchanged by a random selection method. Firstly, a component optimizing section 316a calculates a whole tact in an initial state (S301). Meanwhile, a state here is such a state that mounting order is defined in a certain pattern, as to all components which configure one task group. Therefore, a whole tact to one state is primarily decided from the mounting point data 14a, the component library 14b, the mounting apparatus information 14c which were stored in the database section 14.

Meanwhile, the "task" in this application means an one time operation, or a group of components which are mounted by the suchlike one time operation, in repetition of a series of operations such as absorption, movement and mounting of components by the multi-mounting head 112 (FIG. 12) which can suck and mount a plurality of components to a substrate. Then, an aggregation of tasks as combination of components and component types is called as "a task group". The term of "task group" is a term which is particularly used in the field of a modular mounting machine, but as described above, this embodiment is also applicable to decision of mounting order in case that mounting machines (high speed rotary machine etc.) other than the modular mounting machine are used.

Then, two points are randomly selected out of all mounting points of them (S302), to calculate a whole tact (temporary tact) in case that mounting order of the selected two mounting points is interchanged (S303). Then, it is judged whether the temporary tact, which has been calculated now, is smaller than tact in an immediately preceding state or not (S304). As a result of that, in case that it is smaller, interchange of those two mounting points is carried out (S305). In sum, as to a current state and a whole tact, they are updated to ones in case that those mounting points were interchanged, and then, they are stored.

Then, it is judged whether a termination condition at that time point (tact at that state is smaller than target tact which has bee designated by an operator in advance, or it came to certain processing time, etc.) is satisfied or not (S306), and in case that it is satisfied, processing is terminated. On one hand, in case that tact does not become smaller even by interchange of two mounting points (NO in S304), and in case that the termination condition is not satisfied (NO in S306), similar processing is repeated again, until the termination condition is satisfied (S302 through S306). In this manner, by a random selection method, in accordance with execution time which is spent, tact with respect to each task group becomes smaller, and component mounting order is optimized.

Meanwhile, in the above-described example, a procedure of carrying out optimization of mounting order of components by the random selection method is described, but optimization may be carried out by other various methods.

According to the optimizing method and apparatus of the suchlike embodiment, optimization of mounting order is carried out even in case that component cassettes were placed randomly, and therefore, it is easy to change a preparatory plan, and it is possible to shorten time which is required for a change of substrates to be produced.

In recent years, the necessity of prompt action to manufacturing of a wide variety of products in small quantities has been heightened. If a component array is optimized as in the past, it is possible to shorten mounting time per one substrate. However, in case of frequently carrying out a change of substrates to be produced, particularly due to small-lot production, a proportion of time for changing a substrate to be produced, of entire substrate production, becomes larger.

Therefore, even if mounting time per one substrate is shortened, substrate exchange time for setting/setting confirmation of component cassettes is lengthened, and therefore, there is such a case that production time of substrates to be produced is lengthened. In this embodiment, it is all right if a user randomly dispose component cassettes without being cognizant of placement of the component cassettes, and therefore, it is possible to significantly reduce substrate exchange time.

Meanwhile, the above-described embodiment described such a case that the component cassette 114 is placed in the component supply section 115 of the component mounting machine 100 and optimization is carried out by reading placement information of that placement, but it is also all right even if the component cassette 114 is placed in the package exchange cart 50 which is described in FIG. 17 and optimization is carried out by reading placement information of that placement.

In this case, it is possible to carry out placement and optimization of components in advance at a place distant from the component mounting machine 100, without using the component supply section 115 of the component mounting machine 100. Thus, it becomes possible to promptly prepare optimization data of substrates to be produced next, during such a period that the component mounting machine 100 is operated. That is, when a substrate is changed over, the package exchange cart 50 is set to the component supply section 115, and optimization data, which is prepared in advance, is further put in the mounting machine 100, and thereby, it is possible to immediately start production of next substrates, and therefore, it becomes further possible to easily and promptly a change of a preparatory plan.

Second Embodiment

By using the optimizing method and optimizing apparatus which relates to the first embodiment, it is possible to save trouble of preparing optimum component array data and setting components exactly along the data, and therefore, it is possible to shorten exchange time of component cassettes. However, in this embodiment, array order of component cassettes is adamantly maintained to be in such a state that they were placed by a user randomly, and therefore, there may be such a case that component mounting time per one piece becomes longer, as compared to such a case that an array of cassettes were considered, depending on a type of a substrate. In case that the production number of the substrate is not so many, it does not become a so serious problem, but as the production number becomes larger, there is such fear that total production time increases. This is because, as the production number becomes larger, influence of component mounting time per one piece becomes larger to the total production time, rather than influence due to exchange time of component cassettes.

Consequently, in this embodiment, it is assumed that mounting time due to mounting order decided by the first embodiment (whole tact due to a first optimization approach) and mounting time in case that an array of component cassettes is changed are compared, and shorter mounting order is adopted. By the suchlike method, it is possible to achieve much shorter mounting time.

FIG. 5 is a block diagram which shows a hardware configuration of an optimization program storage section in an optimizing apparatus which relates to the second embodiment of the invention. In the same figure, the same reference numerals and signs are applied to portions which are overlapped with those of FIG. 1 which were described in the first embodiment. As shown in FIG. 5, an optimization program storage section 20 of this embodiment has a first whole tact calculating section 21, an optimization information generating section 22, a second whole tact calculating section 23, and an optimizing method deciding section 24.

The first whole tact calculating section 21 calculates, as described in the first embodiment, entire substrate production time (whole tact; as to substrates which will be produced from now, production time which is required for producing all of that production number), in case that an array of placed component cassettes is fixed and optimization is carried out. The optimization information generating section 22 optimizes an array of component cassettes, in consideration of XY moving time and nozzle exchange time etc. That is, mounting order is optimized by changing an array of component cassettes.

The second whole tact calculating section 23 calculates whole tact in case that optimization is carried out in the optimization information generating section 22. The optimizing method deciding section 24 selects and decides any optimizing method, on the basis of calculation results of the first whole tact calculating section 21 and the second whole tact calculating section 23.

Figure 6:
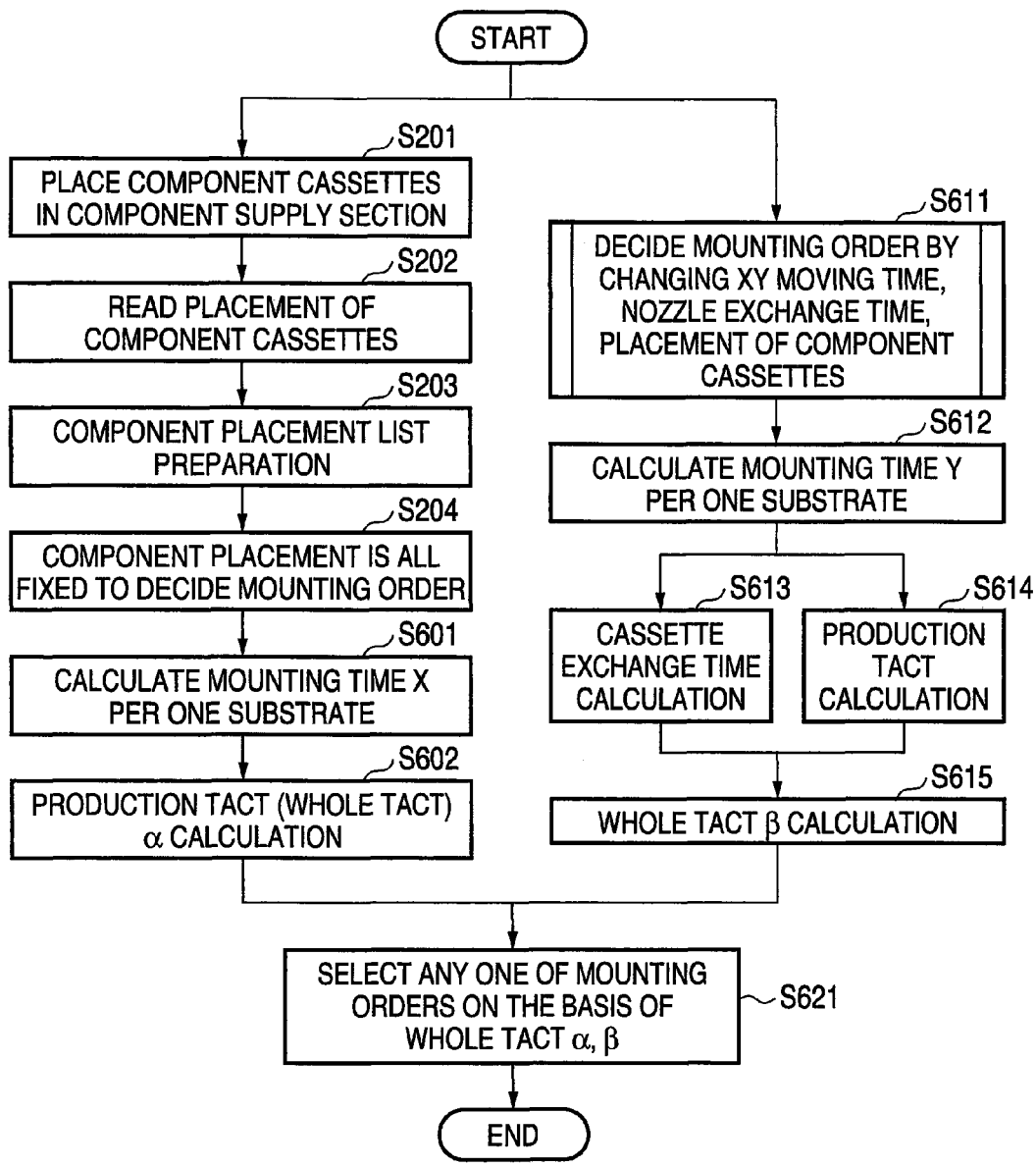
FIG. 6 is a flow chart which shows an optimizing method which relates to the second embodiment.

FIG. 6 is a flow chart which shows an optimizing method which relates to the second embodiment. As shown in FIG. 6, firstly, as a first optimization approach, in S201 through S204, component placement is all fixed and then, mounting order is decided. This deciding method is the same as that in the first embodiment shown in FIG. 2. Then, mounting time X per one substrate is calculated (S601). Meanwhile, in case that a method shown in FIG. 3 is used as a mounting order deciding procedure in S204, mounting time (tact) per one substrate is calculated in that procedure, and therefore, it is all right if that value is used as X.

Then, on the basis of production number D, mounting time X, of substrates, which were inputted by the input section 13, production tact α (=X×D) is calculated (S602). In this first optimization approach, this production tact α is whole tact which is total time for substrate production including substrate exchange time (since production is carried out without any change of an array of component cassettes which were already placed, actual exchange time is 0).

On one hand, the optimization information generating section 22 decides mounting order by changing XY moving time of a work head, nozzle exchange time, placement of component cassettes, as a second optimization approach (S611).

Figure 7:
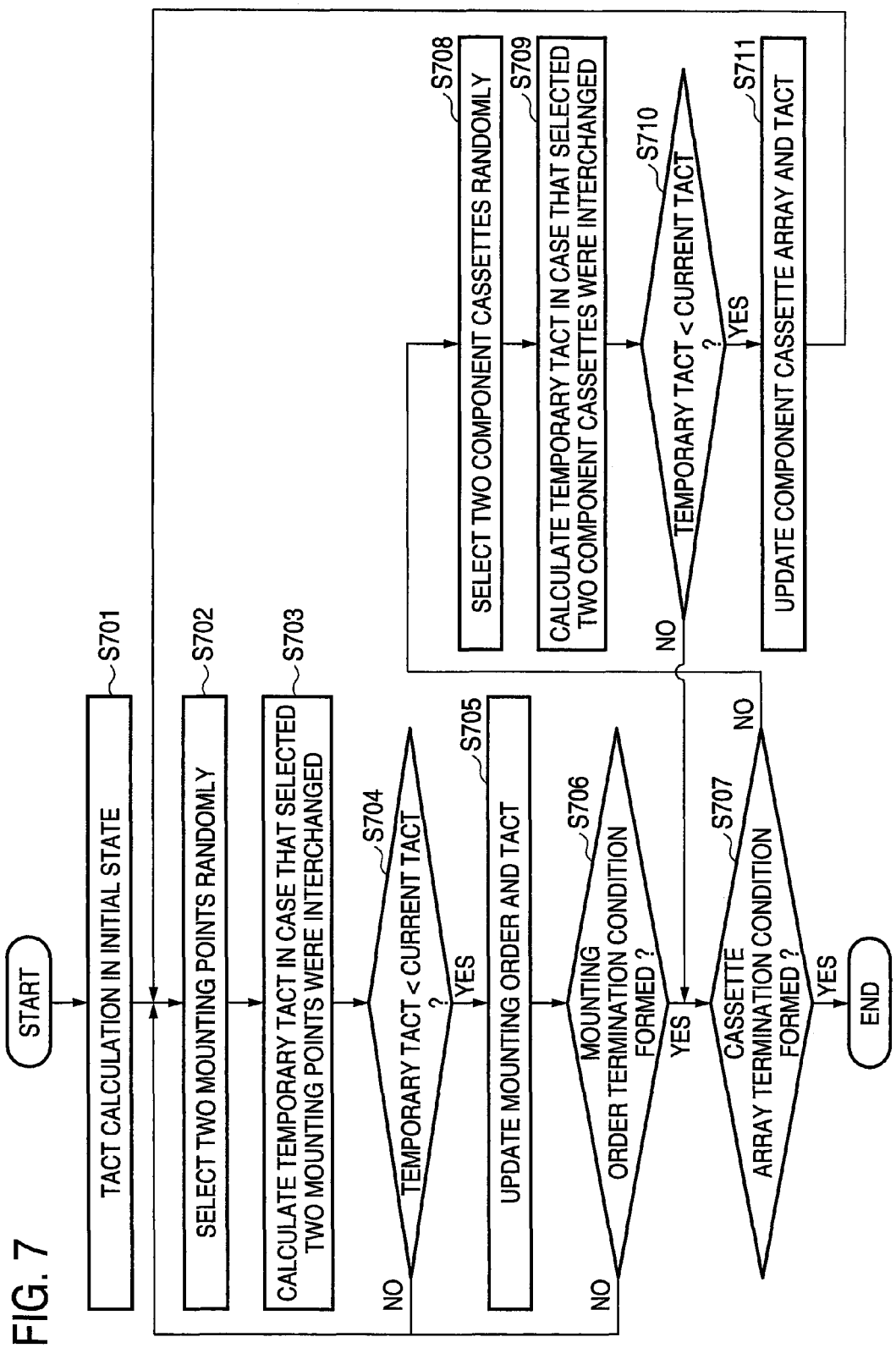
FIG. 7 is a flow chart which shows a mounting order deciding method which relates to the second embodiment.

In a order deciding method of FIG. 3, on the assumption that array order of component cassettes is fixed, temporary tack is calculated by exchanging mounting order of mounting points. In other words, a change of tact in case that array order of component cassettes is changed is not reflected at all. Considering this point, such an example that array order of component cassettes is also considered for calculation of tact in a step S611 is shown in FIG. 7 (expanded random selection method). Processes from S701 through S706 are the same as S301 through S306 of FIG. 3. Then, in the example of FIG. 7, after it is judged that a termination condition of mounting order is satisfied (YES in S706), it is judged whether a termination condition of cassette array (tact at that state is smaller than target tact which has bee designated by an operator in advance, or it came to certain processing time, etc.) is further satisfied or not (S707). Then, in case that it is satisfied, processing is terminated (YES in S707). On one hand, in case that the termination condition is not satisfied (NO in S707), two component cassettes are randomly selected under the mounting order (S708), and temporary tact in case that the selected two component cassettes were interchanged is calculated (S709). Then, it is judged whether temporary tact, which has been calculated now, is smaller than tact in an immediately preceding state or not (S710). As a result of that, in case that it is smaller (YES in S710), a component cassette array and tact are updated. On one hand, in case that the temporary tact, which has been calculated now, is larger than tact in an immediately preceding state (NO in S710), similar processing is repeated again (S707 through S709). In this manner, by a random selection method which is expanded up to decision of a cassette array, tact with respect to each task group becomes smaller, in accordance with execution time which is spend, and component mounting order is optimized.

Returning to FIG. 6, mounting time Y per one substrate in mounting order decided in S611 is calculated (S612). Meanwhile, in case that the method shown in FIG. 3 or 7 is used as a mounting order deciding procedure in S611, mounting time (tact) per one substrate is calculated in that procedure, and therefore, it is all right if that value is used as Y.

Then, on the basis of a difference of placement of component cassettes prior to carrying out exchange of component cassettes, and placement of component cassettes obtained in S611, the number A of cassettes to be exchanged is obtained. Then, cassette exchange time A×B is calculated from A and cassette exchange time B per one piece which is inputted from the input section 13 (S613). Meanwhile, the cassette exchange time B per one piece may have been given in advance to the second whole tact calculating section 23.

In addition, on the basis of substrate production number C which is inputted from the input section 13 and the mounting time Y which is calculated in S612, production tact C X Y, which is necessary for substrate production, is calculated (S614).

Then, the cassette exchange time and the production tact are added to obtain whole tact β (=A×B+Y×C) (S615).

Then, the optimizing method deciding section 24 selects and decides mounting order which is any one of optimization approaches, on the basis of the whole tact α, β (S621). As to this selection/decision, one with smaller whole tact is selected.

Meanwhile, in the above-described embodiment, the optimizing apparatus carried out selection/decision of any one of optimization approaches, but it is also all right even if whole tact which is obtained in the step S602 and the step S615, mounting time per one piece, cassette exchange time, production number etc., which become a basis for obtaining that whole tact, are displayed on the display section 12, and a user decides any one of approaches on the basis of that information.

In addition, in case that there is mounting point data with kinds of a plurality of substrates to be produced, in advance, as the second optimization approach, and further, as to each of a nozzle, a component cassette, a support pin which supports a substrate at the time of mounting, optimization may be carried out so as to preferably reduce exchange which comes with substrate exchange, in consideration of a portion which can be used in common.

According to the suchlike second embodiment, it is possible to compare and select such optimization that an array of component cassettes placed in the component supply section is fixed and such optimization that an array of component cassettes is changed, and therefore, it is possible to provide a mounting order optimizing method and apparatus for carrying out production more promptly.

Third Embodiment

By using the optimizing method and optimizing apparatus which relates to the first embodiment, it is possible to save trouble of preparing optimum component array data and setting components exactly along the data. However, need of carrying out a preliminary optimizing process prior to component mounting still remains. In addition, particularly in a modular mounting machine which mounts components while a mounting head having a plurality of nozzles like the multi-mounting head 112 is moving in XY directions, it becomes a problem how components are sucked from component cassettes in minimum time by a multi-nozzle, in case of deciding mounting order of components. On this account, it becomes an important problem to decide such a combination of components that components are sucked from a plurality of component cassettes simultaneously in a lump, or component can be sucked from a plurality of component cassettes to a multi-nozzle at a minimum moving distance.

Consequently, in this embodiment, preliminary optimization to an array of component cassettes which a user set randomly is not carried out, and it is considered how a plurality of components are sucked by a head and mounted on a substrate in short time, with respect to each task (one time operation of absorption and mounting of components). On this account, a type and the number of components to be mounted have been obtained in advance, and control of the head is carried out so as to suck an suckable component at the time that it is mounted.

Figure 8:
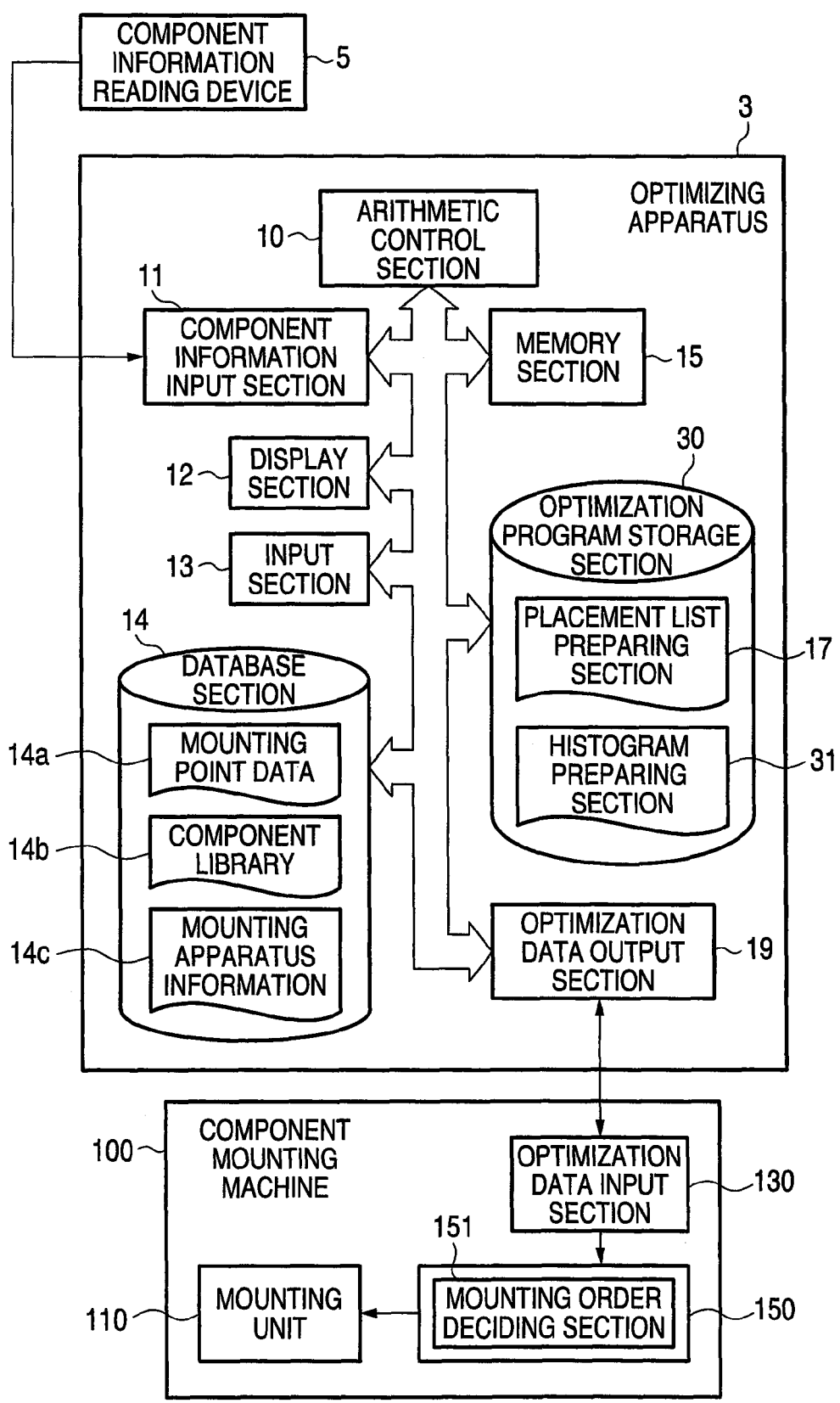
FIG. 8 is a block diagram which shows a schematic configuration of an optimizing apparatus which relates to the third embodiment of the invention.

FIG. 8 is a block diagram which shows a schematic configuration of an optimizing apparatus which relates to the third embodiment of the invention. In the same figure, the same reference numerals and signs are applied to portions which are overlapped with those of FIG. 1 which were described in the first embodiment.

As shown in FIG. 8, an optimization program storage section 30 in the optimizing apparatus of this embodiment has a histogram preparing section 31. In addition, the component mounting machine 100 has a mounting order deciding section 151, and is equipped with a mounting machine control section 150 which controls a mounting unit 110.

Figure 9:
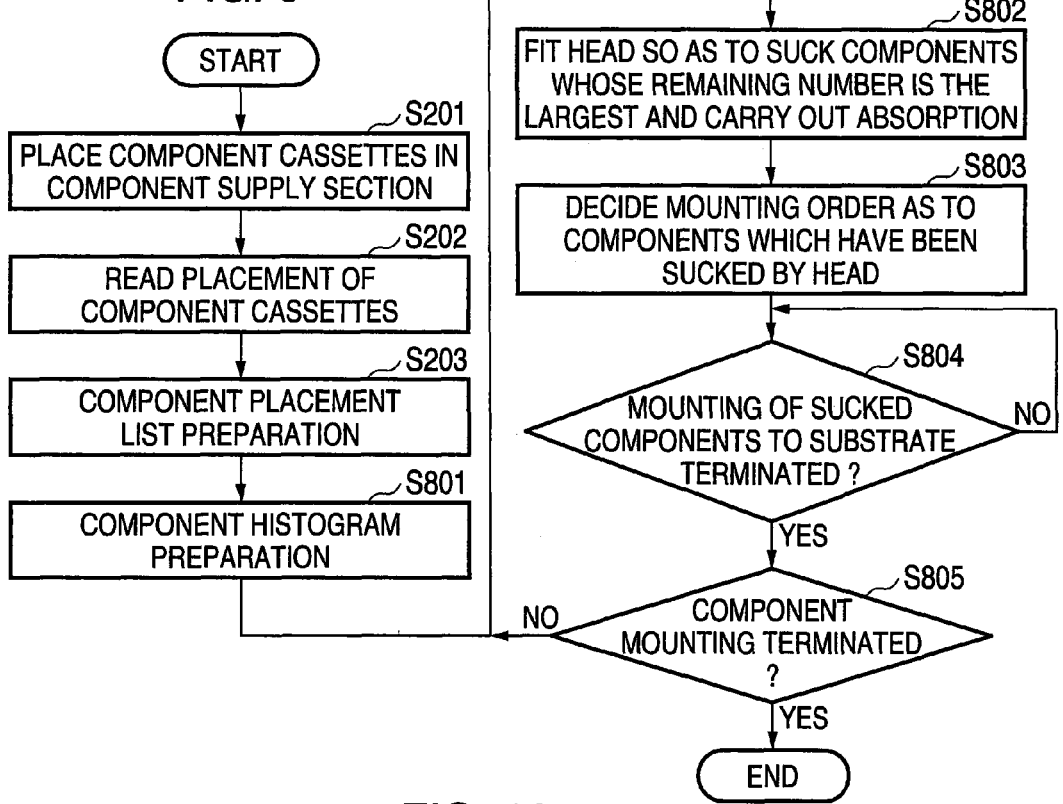
FIG. 9 is a flow chart which shows a component mounting method which relates to the third embodiment.

FIG. 9 is a flow chart which shows a component mounting method which relates to the third embodiment. As shown in FIG. 9, a component cassette is placed (S201), and component information, which is attached to the placed component cassette, is read by the component information reading device 5 (S202), and on the basis of the read identification information, a component placement list is prepared (S203). Then, the histogram preparing section 31 prepares a component histogram, on the basis of the prepared component placement list and mounting point data 14a which is stored in the database section 14 (S801).

Figure 10:
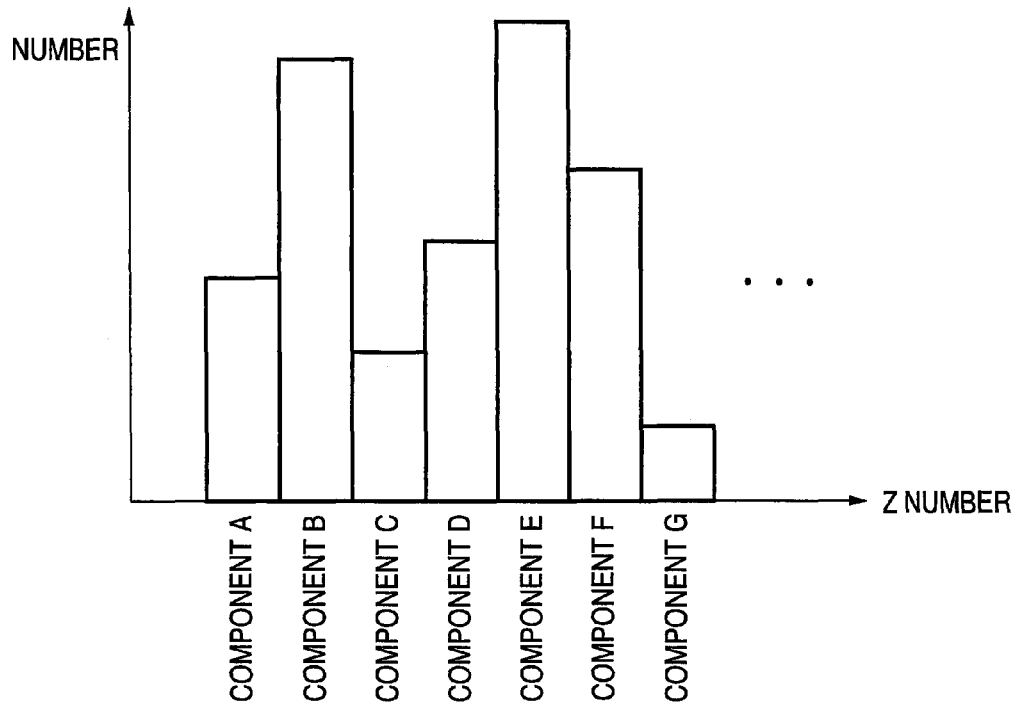
FIG. 10 is a component histogram which shows a relation of a component array and the number thereof to be mounted.

FIG. 10 is a component histogram which shows a relation of a component array and the number thereof to be mounted. As shown in FIG. 10, the component histogram is a histogram which shows a relation of Z numbers (array positions of components) and the number of components placed on that Z numbers, which should be mounted on a substrate. This histogram is obtained from an array list which shows association of Z numbers and component cassettes (component names) placed by a user randomly, mounting components which are obtained from mounting point data and the number thereof.

Then, the mounting machine control section 150 fits a position of the work head 112 so as to suck components whose remaining number to be mounted is the largest, and sucks that component and a component which can be sucked simultaneously (S802). It is preferable that the mounting machine control section 150 refers to the remaining number of components to be mounted, and fits the work head 112 to such a position that it can suck components whose remaining number is the largest, and the number of simultaneously suckable components becomes larger. By this means, it is possible to raise absorption efficiency. Furthermore, in case that simultaneous absorption is carried out and furthermore, there exists an suckable vacant absorption nozzle, it is desirable to carry out absorption until vacant nozzles are all filled up.

Then, when component absorption to the absorption nozzle is completed, the mounting order deciding section 151 decides mounting order to the components which are sucked (S803). This decision of mounting order is carried out by a greedy method, on the basis of, for example, mounting point data and mounting time to an sucked component which is calculated by a component sucked by the work head. The greedy method is a method of deciding mounting order so as to carry out mounting sequentially in the order of close mounting points among mounting points on a substrate. In sum, it is one which decides such mounting order that a head moves through the shortest path, as to that task (a group of components which are sucked by an sucking head).

That is, in the optimizing method of this embodiment, when the component histogram is prepared, component sucking processing is carried out by the component mounting machine in first, and every time the sucking processing is carried out, decision of mounting order is carried out in each case. Therefore, simply by inputting mounting point data and supplying components which were placed randomly, it becomes possible to carry out optimization of mounting order over carrying out a work of component mounting.

Then, when substrate mounting of sucked components is terminated (YES in S804), it is judged whether mounting of components is terminated or not (S805). Then, in case that there is a component to be mounted yet (NO in S805), it goes back to S802.

According to the suchlike third embodiment, it becomes possible to quickly carry out start of a mounting work of components onto a substrate by a mounting apparatus, and therefore, it is possible to respond to urgent production, particularly in case that the number of substrates is small. That is, with respect to each task, mounting order is decided by a mounting machine in each case, and therefore, there is no need to decide mounting order in advance, and it is possible to promptly start mounting.

Fourth Embodiment

As described in explanations of FIGS. 18 and 19, in a modular mounting machine like the multi-mounting head 112, there is such a case that there is a certain restriction condition (restriction etc. which come with a tape width of a component cassette) to component placement. Because of the suchlike restriction condition, there is such a case that it is not necessarily possible to mount components by use of results of the above-described embodiments, In the suchlike case, decision of mounting order in consideration of the restriction condition becomes necessary.

Then, in this embodiment, it is configured to judge whether an array of component cassettes which a user set randomly violates the restriction condition or not. Alternately, it is configured to carry out decision of mounting order, so as to satisfy the restriction condition.

Figure 11:
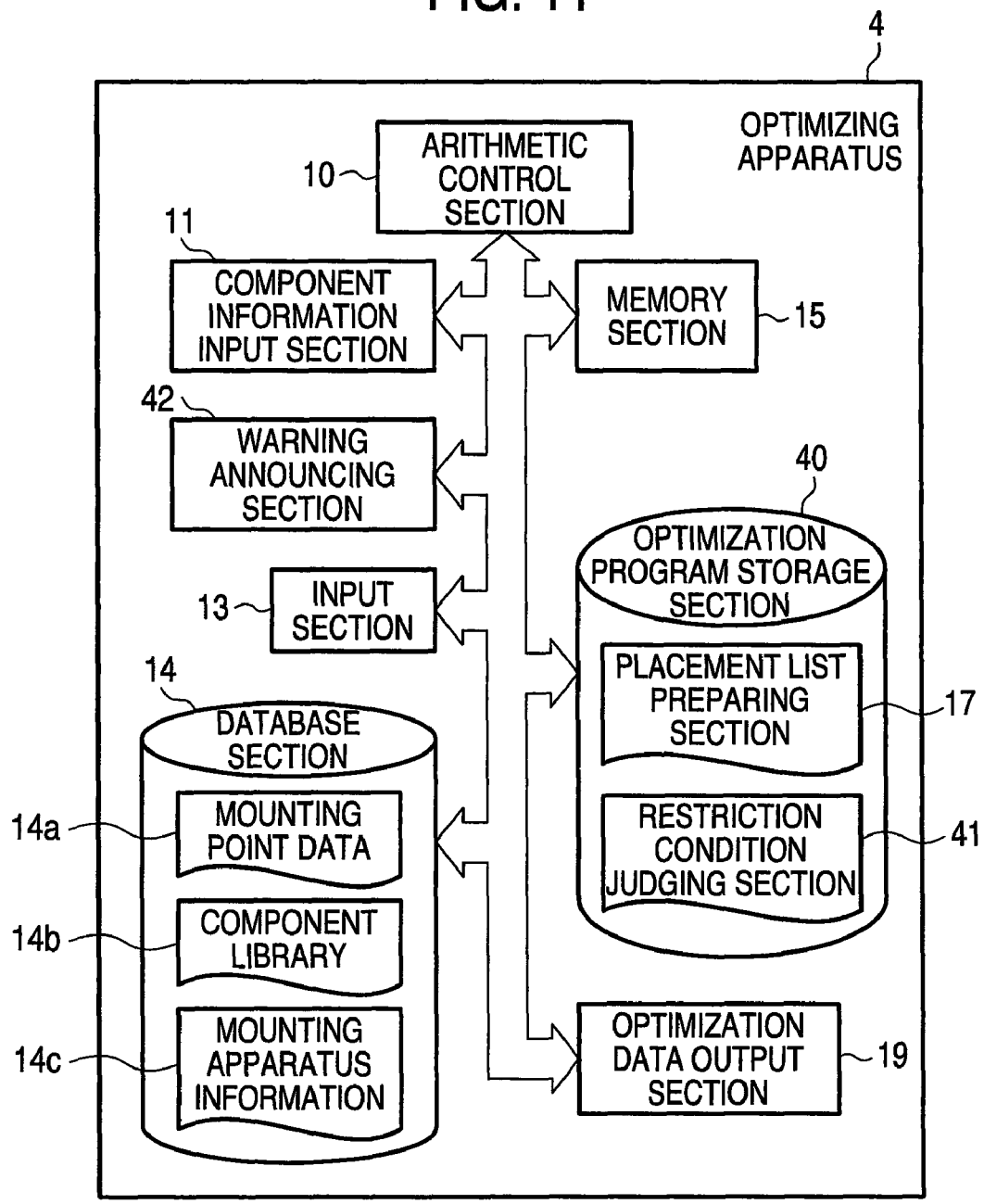
FIG. 11 is a block diagram which shows a schematic configuration of an optimizing apparatus which relates to the fourth embodiment of the invention.

FIG. 11 is a block diagram which shows a schematic configuration of an optimizing apparatus which relates to the fourth embodiment of the invention. In the same figure, the same reference numerals and signs are applied to portions which are overlapped with those of FIG. 1 which were described in the first embodiment. As shown in FIG. 11, an optimizing apparatus 4, which operates as a restriction condition judging device in this embodiment, is equipped with a restriction condition judgment program storage section 40, and a warning announcing section 42.

The restriction condition judgment program storage section 40 has a restriction condition judging section 41. In addition, the warning announcing section 42 is configured to have a display section 12, a light emitting section such as LED, a sound output section which outputs warning sound and guidance, and so on.

Here, the restriction condition is one which relates to restriction of placement positions of components descried in FIG. 19. In case of optimization in which placement positions of components are specified as in the past, optimization processing is carried out in consideration of this restriction condition in advance, and thereby, it is possible to avoid component placement which violates the restriction condition. On one hand, in the first through third embodiments, it is possible to carry out optimization by carrying out placement of components randomly, and therefore, there is such a case that there occurs component placement which violates the restriction condition. Consequently, in case that there occurred violation of the restriction condition as in this embodiment, a warning is announced to a user, and thereby, it becomes possible to carry out component placement with respecting the restriction condition.

Figure 12:
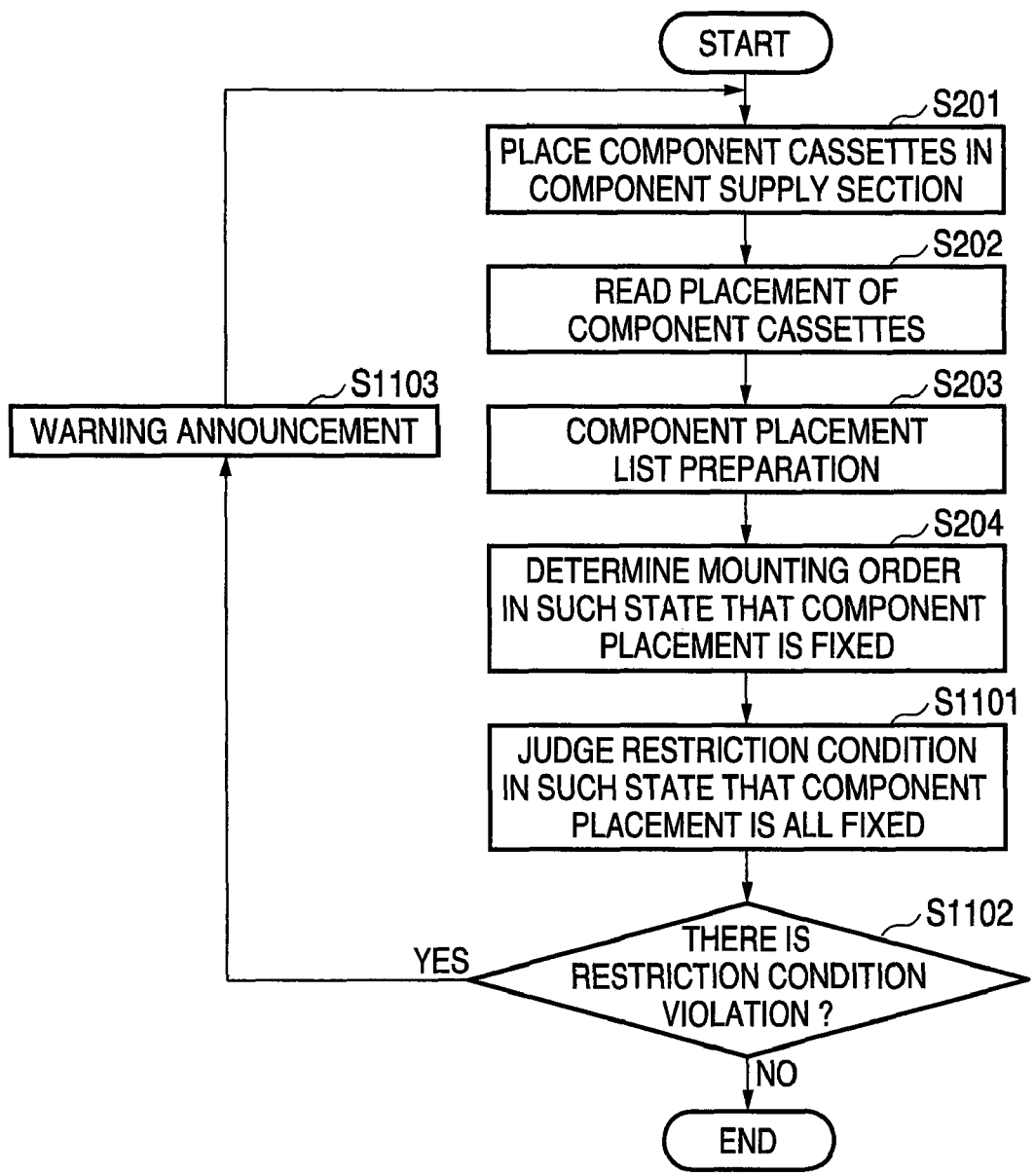
FIG. 12 is a flow chart which shows a restriction condition judging method which relates to the fourth embodiment.

FIG. 12 is a flow chart which shows a restriction condition judging method which relates to the fourth embodiment. Components are placed in a component supply section (or package exchange cart 50) (S201), and placement of component cassettes is read (S202), and a component placement list is prepared (S203). A deciding mounting order of components is decided (s204) in such a state that the array of the component cassettes are fixed. Which component is to be sucked is determined, and which nozzle sucks the determined component is decided. Then, the restriction condition judging section 41 judges whether placement positions of components violate a restriction condition or not, on the basis of a component placement list and restriction information in mounting apparatus information 14c (S1101).

As a result of mounting order being decided by processes of S201 through S204, it is decided which component is sucked by which nozzle. This means that it is decided which sucking nozzle sucks a component of which component cassette. On this occasion, as shown in FIG. 19(b), there is such a case that absorption of components by sucking nozzles receives restriction depending on a type of a component cassette. Therefore, it is possible to judge whether a combination of Z number of a component cassette and an sucking nozzle (position of a head) violates a restriction condition or not, on the basis of "O" and "-" in FIG. 19(b). This judgment is the above-described process of S1101.

Meanwhile, in the first and second embodiments, it is all right even if it has been decided in advance to select only a combination of an sucking nozzle which is shown by "O" in FIG. 19(b) (position Z number of a head) and a component cassette. On one hand, in the third embodiment, in order to decide mounting order with respect to each task in each case, on the basis of the histogram of FIG. 9 (S802 of FIG. 9), at the time point that a component cassette is set, it has not yet decided which nozzle (head) carries out absorption. Therefore, judgment as in S1101 is impossible. However, on the occasion of deciding mounting order with respect to each task, it is possible to decide mounting order in consideration of restriction.

Then, in case that there is restriction condition violation (YES in S1102), it is announced from the warning announcing section 42 that there is restriction condition violation (s1103). As this announcing method, it may be announced by display on a display section, blinking of a light emitting section, generation of warning sound etc. which show that there occurred restriction violation, or by display of at which portion of a Z axis restriction violation is generated in component placement, or audio guidance. When a warning is announced, it goes back to a work of placing components so as to eliminate the restriction violation.

In addition, in case that there is no restriction condition violation (S1102), restriction condition judging processing is terminated. After that, it is all right even if mounting order optimizing processing with component array being fixed is carried out, as in the first embodiment and the second embodiment.

According to the suchlike fourth embodiment, even in case of carrying out optimization of component mounting order by carrying out component placement randomly, a warning is announced in case that there occurred restriction condition violation of component placement, and thereby, it is possible to carry out component placement which fits with a restriction condition.

Fifth Embodiment

In an explanation of the above-described each embodiment, the component cassettes 114, which were set in the component supply sections 115a, 115b of the component mounting machine 100, are based on the assumption that they contain all components necessary for production of substrates. However, in case that a user set component cassettes randomly in the component supply section, all component cassettes of necessary components are not always set, and there can be such a case that there occur deficient components. In the suchlike case, it is preferable that control is carried out so as to give a warning of existence of a deficient component cassette. In this embodiment, the suchlike warning is carried out.

Figure 13:
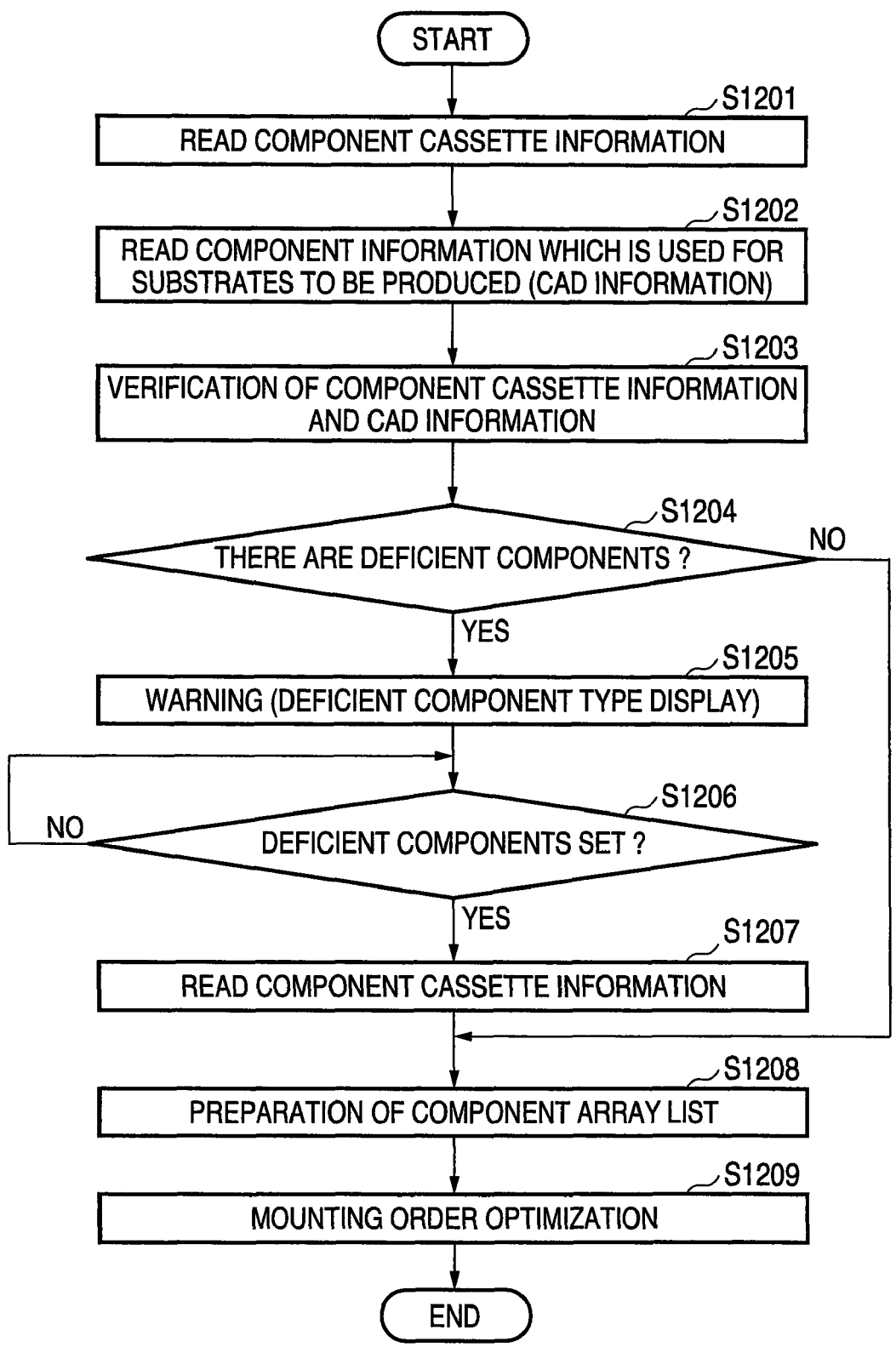
FIG. 13 is a flow chart which shows a deficient component warning method which relates to the fifth embodiment of the invention.

FIG. 13 is a flow chart which shows a deficient component warning method which relates to the fifth embodiment. firstly, when a user places components cassettes in the component supply section 115, identification information which is attached to the placed component cassette (component cassette information) is read by the component information reading device 5 (S1201). Then, the arithmetic control section 10 reads information of components to be used on substrates which have become current production objects, as CAD information from an external PC etc. (S1202). As a matter of course, in the same manner as in the first embodiment, it is all right if component types (component names) are read from mounting point data 14a which have been held in advance.

Then, the arithmetic control section 10 verifies the above-described component cassette information and CAD information (S1203). As a result of verification, in case that it is judged that there is no deficient component (NO in S1204), in the same manner as in the above-descried embodiments, a component array list is prepared (S1208), and optimization of mounting order is carried out (S1209).

On one hand, as a result of verification, in case that it is judged that there is a deficient component (YES in S1204), such a warning that there exists a deficient component and a type of the deficient component are displayed through the display section 12 (S1203). Then, it is judged whether a user, who saw this warning, sets a component supply section of the deficient component to the component supply section 115 or not (S1206). This judgment is kept on intermittently, until the cassette is set (No in S1206). Then, when the cassette is set (YES in S1206), component cassette information is read again (S1207), and in the same manner as in the above-described embodiments, a component placement array list is prepared (S1208), and optimization of mounting order is carried out (S1209).

Meanwhile, in the above-described procedure, there is no such case that optimization is started, until deficient components are set. Howe3ver, it is also all right even if mounting is started, after existence of deficient components is ignored and mounting order for mounting only components which are currently set is determined. In this case, it is possible to configure so as to start mounting of deficient components at the time point that the deficient components were set.

A deficient component warning method in this embodiment can be used as preprocessing of the above-described all embodiments, and it becomes possible to appropriately respond to deficiency generation of components which comes along changeover of substrates to be produced.

MODIFIED EXAMPLE 1 OF FIFTH EMBODIMENT

In the fifth embodiment, in case that it became clear that a plurality of cassettes of identical components are set in a component supply section at the time point that component cassette information and CAD information were verified (S1203 in FIG. 13), it is possible to further dispose control like 1), 2) as follows. In addition, it is also possible to configure an optimizing apparatus in such a manner that any one of 1), 2) can be selected.

1) Components are sucked from any one of component cassettes, and components of another component cassette are used as spare parts at the time of shortage of components.

2) Mounting points of relevant components in CAD information are allocated to a plurality of component cassettes.

MODIFIED EXAMPLE 2 OF FIFTH EMBODIMENT

In the fifth embodiment, verification is carried out including substitute components in component cassette information, at the time point that component cassette information and CAD information were verified (S1203 in FIG. 13). The "substitute component" means a component which can be deemed to be substitutable, as a component which can realize the same use/function as an original component, even if a component name, shape etc. are different. If a substitute component to a designated component has been registered in advance, even if a component, which is read from a component cassette does not coincide with the designated component but if it coincides with a name of a substitute component, a component array list is prepared on the assumption that the substitute components were set, and mounting order is decided.

MODIFIED EXAMPLE 3 OF FIFTH EMBODIMENT

In the fifth embodiment, deficiency generation of components in a signal component mounting machine is monitored, and in case that there occurred deficiency of components, a predetermined warning is carried out. In contrast to this, in this modified example, in a production line which is equipped with a plurality of component mounting machines, in case that there occurred component deficiency in at least one of the plurality of component mounting machines, control to give a warning of existence of a deficient component cassette is carried out. That is, this modified example is one in which a deficient component warning is expanded from a level of a component mounting machine up to a level of a production line.

Figure 14:
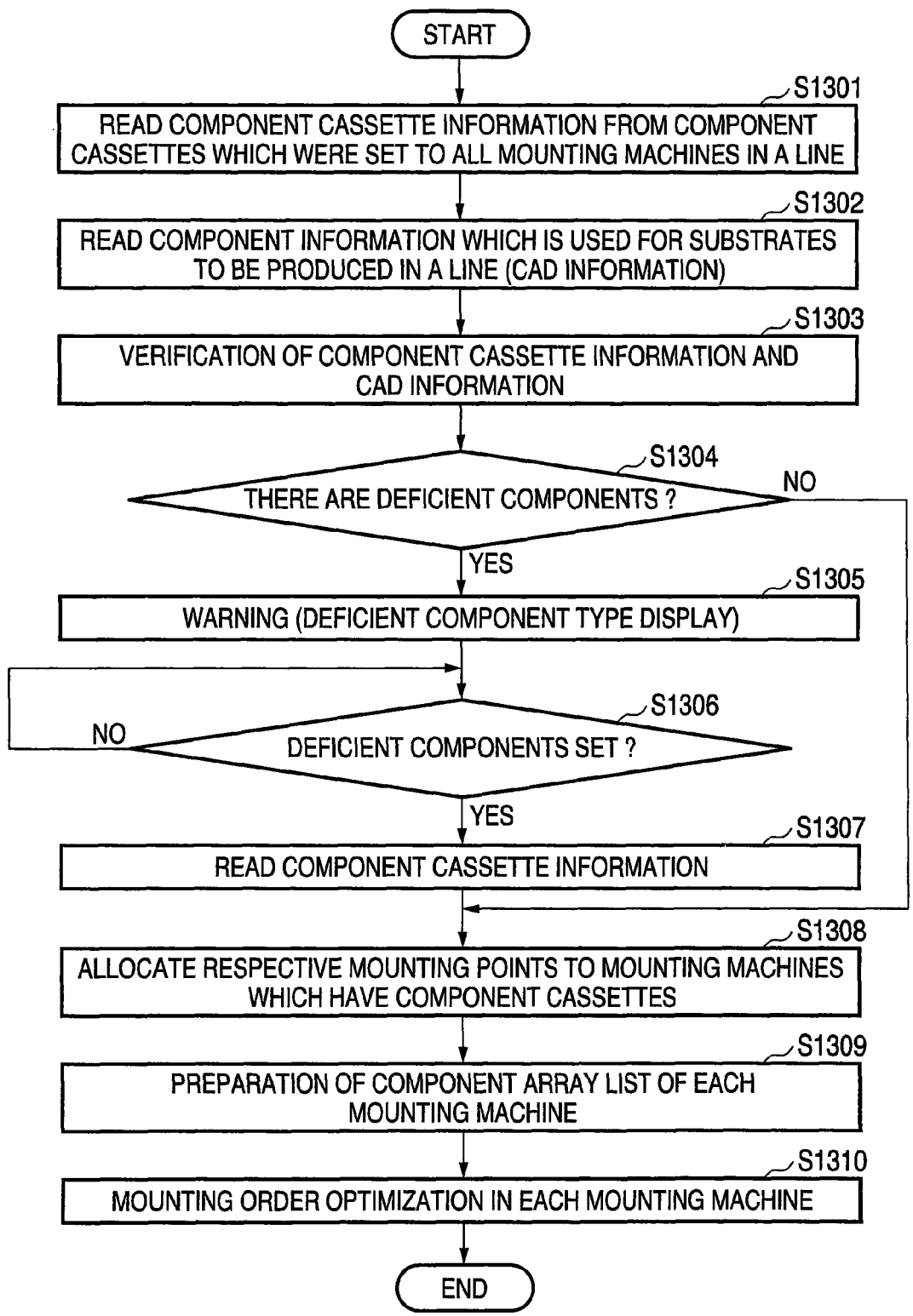
FIG. 14 is flow chart showing a deficient component warning method which relates to the modified example 3 of the fifth embodiment of the invention.

FIG. 14 is a flow chart showing a deficient component warning method which relates to the modified example 3 of the fifth embodiment. Firstly, when a user places component cassettes in component supply sections of all mounting machines in a production line, identification information (component cassette information), which is attached to the placed component cassettes, is read by a component information reading device in each mounting machine (S1301). Then, an arithmetic control section of each mounting machine reads information of components to be used on substrates which have become current production objects, as CAD information from an external PC etc. (S1302). As a matter of course, in the same manner as in the first embodiment, it is all right if component types (component names) are read from mounting point data 14a which have been held in advance.

Then, the arithmetic control section 10 verifies the above-described component cassette information and CAD information (S1304). As a result of verification, in case that it is judged that there is no deficient component (NO in S1304), respective mounting points are allocated to mounting machines which have component cassettes (S1308). Then, in the same manner as in the above-descried embodiments, a component array list is prepared (S1309), and optimization of mounting order is carried out (S1310).

On one hand, as a result of verification, in case that it is judged that there is a deficient component (YES in S1304), such a warning that there exists a deficient component and a type of the deficient component are displayed through the display section 12 (S1305). Then, it is judged whether a user, who saw this warning, sets a component cassette of the deficient component to the component supply section 115 or not (S1306). This judgment is kept on intermittently, until the cassette is set (No in S1306). Then, when the cassette is set (YES in S1306), component cassette information is read again (S1307), and respective mounting points are allocated to mounting machines which have component cassettes (S1308). Then, in the same manner as in the above-described embodiments, a component placement array list is prepared (S1309), and optimization of mounting order is carried out (S1310).

The above-described embodiments showed such a case that an optimizing apparatus and an array information reading device are disposed separately, but they may be integrated. In addition, it is also all right even if the component mounting machine 100 is equipped with the optimizing apparatus in respective embodiments. In addition, in this embodiment, a plurality of nozzles are disposed on a single mounting head, but the number of a mounting head is not limited to one per one component mounting machine, and it can receive a plurality of them. In addition, even in case that a plurality of mounting heads each having one nozzle were disposed on a component mounting machine, this invention is applicable thereto.

As above, each embodiment of the invention is described, but the invention is not limited to matters which were shown in the above-descried embodiments, and it is what the invention has planned that a person with ordinary skill in the art carries out modification/application on the basis of descriptions of claims and a specification, and well-known technologies, and it is included in a scope to be sought for protection.

The invention has such an advantage that it is easy to change a preparatory plan and it is possible to shorten time necessary for a change of substrates to be produced, and is useful for a component mounting order deciding method and a component mounting order deciding apparatus etc. which target at a component mounting machine etc.

The invention claimed is:

1. A component mounting order deciding method which targets at such a component mounting machine that a component is sucked by a mounting head which is capable of sucking a component, from an array of a plurality of component cassettes in which components are placed, and the component is placed on a substrate by moving the mounting head, and which decides mounting order of components by a computer; comprising the steps of:

randomly disposing the array of the component cassettes in a component supply section of the component mounting machine, thereby establishing for each component cassette a position where the component cassette is disposed in the component supply section;

obtaining component placement data to be obtained by reading identification information of a component stored in the component cassette disposed in the component supply section;

preparing a component placement list in the component supply section by associating the read identification information of the component cassette with the position where the component cassette is disposed in the component supply section, based on the basis of the component placement data; and subsequent to said step of randomly disposing, deciding mounting order of components on the basis of the prepared component placement list, including on the basis of the position where the component cassette is disposed in the component supply section established during said step of randomly disposing, in such a state that the array of the component cassettes are fixed.

2. The component mounting order deciding method according to claim 1, further comprising the steps of:

reading identification information of the component stored in the component cassette, from an IC tag which is disposed on the component cassette or a component tape in the component cassette;

specifying a position of the component cassette, from position information received from the IC tag; and preparing a component placement list, on the basis of the specified position of the component cassette and identification information which is read.

3. The component mounting order deciding method according to claim 1, wherein the step of deciding mounting order includes the step of:

referring to mounting point information including information regarding positions of components to be mounted on the substrate, so as to change mounting order regarding those mounting points; and calculating mounting time under the changed mounting order, so as to obtain mounting order by which the mounting time becomes shorter.

4. The component mounting order deciding method according to claim 1, wherein the decided mounting order is used as first mounting order, and the component mounting order deciding method further comprises the steps of:

obtaining second mounting order which is mounting order under the first mounting order, and further in such a state that an array of component cassettes is changed;

comparing mounting time of the first mounting order and mounting time of the second mounting order which includes time for a user to change the array of the component cassettes; and selecting any one of the first mounting order and the second mounting order.

5. The component mounting order deciding method according to claim 1, wherein:
in case that the mounting head has a plurality of nozzles, the step of deciding mounting order includes the steps of:
preparing a histogram showing a relation of components to be mounted and the number of the components, on the basis of the array of the component cassettes;
deciding a component cassette including components whose number is the largest, based on the histogram; and
deciding a component which can be sucked at the same time of sucking a component from the decided component cassette; and
the mounting order is decided on the basis of the decided component cassette and a component which can be sucked.

6. The component mounting order deciding method according to claim 1, wherein:
the component mounting order deciding method further comprises the steps of:
judging whether deficient components exist or not, after the component cassette is disposed in the component supply section;
announcing a warning when that deficient components exists is judged; and
judging whether a component cassette, which includes the deficient components, is set to the component supply section or not, after the step of announcing.

7. The component mounting order deciding method according to claim 6, wherein:
in the step of judging whether deficient components exist or not, in case such that it is clear that a plurality of component cassettes containing same components is disposed in the component supply section, any one of the following steps is carried out:
1) components are sucked on a preferential basis from any one component cassette among the plurality of component cassettes, and components in other component cassettes are treated as spare components at the time of shortage of components, or
2) mounting points on the substrate are allocated with respect to each of the plurality of component cassettes.

8. The component mounting order deciding method according to claim 6, wherein in the step of judging whether deficient components exist or not, in case such that there exists substitute components for a component cassette, the substitute components are treated as components to be mounted on the substrate.

9. The component mounting order deciding method according to claim 6, wherein:
in case such that a plurality of component mounting machines exist on a production line of the substrate, the step of judging whether deficient components exist or not is carried out as to all of the plurality of component mounting machines.

10. A component mounting order deciding program which has a computer execute each step of the component mounting order deciding method according to claim 1.

11. A non-transitory computer readable recording medium on which the component mounting order deciding program according to claim 10 is recorded.

12. A component mounting order deciding apparatus which targets at such a component mounting machine that a component is sucked by a mounting head which is capable of sucking a component, from an array of a plurality of component cassettes in which components are placed, and the component is placed on a substrate by moving the mounting head, and which decides mounting order of components by a computer, comprising:
a reading data obtaining section, obtaining component placement data to be obtained by reading identification information of the component stored in the component cassette which is disposed in a component supply section, component placement list preparing section, preparing a component placement list in the component supply section by associating the read identification information of the component cassette with a position where the component cassette is disposed in the component supply section, on the basis of the component placement data; and
a mounting order deciding section, deciding mounting order of components on the basis of the prepared component placement list, in such a state that the array of the component cassettes is fixed, wherein the array of the component cassettes is randomly disposed in the component supply section of the component mounting machine thereby establishing for each component cassette the position where the component cassette is disposed in the component supply section, and wherein said deciding mounting order of components occurs subsequent to the array of the component cassettes being randomly disposed in the component supply section and based on the position where the component cassette is disposed in the component supply section for each component cassette.

13. The component mounting machine which is equipped with the component mounting order deciding apparatus according to claim 12, and a control section which mounts components on a substrate by the component mounting order decided by the component mounting order deciding apparatus.

* * * * *